(12) United States Patent
Dembo et al.

(10) Patent No.: US 8,083,128 B2
(45) Date of Patent: Dec. 27, 2011

(54) SEMICONDUCTOR DEVICE

(75) Inventors: Hiroki Dembo, Atsugi (JP); Tomoaki Atsumi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1137 days.

(21) Appl. No.: 11/607,022

(22) Filed: Dec. 1, 2006

(65) Prior Publication Data

US 2007/0126059 A1  Jun. 7, 2007

(30) Foreign Application Priority Data

Dec. 2, 2005  (JP) ................................ 2005-349970

(51) Int. Cl.
*G06F 17/00* (2006.01)
(52) U.S. Cl. ....................... 235/375; 235/492
(58) Field of Classification Search .................. 235/375, 235/487, 492
See application file for complete search history.

(56) References Cited

U.S. PATENT DOCUMENTS

| 6,509,217 | B1 * | 1/2003 | Reddy ........................... 438/153 |
| 7,468,668 | B2 * | 12/2008 | Akiyama et al. ............ 340/572.1 |
| 2006/0022804 | A1 * | 2/2006 | Akiyama et al. ............ 340/10.51 |

FOREIGN PATENT DOCUMENTS

| JP | 2002-304605 | 10/2002 |
| JP | 2004-248310 | 9/2004 |

* cited by examiner

*Primary Examiner* — Daniel St. Cyr
(74) *Attorney, Agent, or Firm* — Eric J. Robinson; Robinson Intellectual Property Law Office, P.C.

(57) ABSTRACT

An object is to provide a semiconductor device which includes an anti-collision function during or after production of an IC chip just by a change of a program, even when there is a change of a specification of a product accompanying a change of the kind or standard of a signal of a wireless means for each product. A semiconductor device includes an arithmetic circuit and a circuit for transmitting/receiving a signal to/from outside. The arithmetic circuit includes a central processing unit, a random access memory, a read only memory, and a controller. The read only memory stores a program for processing collision avoidance in transmitting/receiving the signal to/from outside. The program is executed in the central processing unit, so that the arithmetic circuit processes collision avoidance.

23 Claims, 17 Drawing Sheets p-channel transistor 1925    n-channel transistor 1926

SEMICONDUCTOR DEVICE

BACKGROUND OF THE INVENTION

1. Field of the Invention

The present invention relates to a semiconductor device. In particular, the present invention relates to a semiconductor device which transmits/receives a signal to/from outside, a so-called IC chip (also called an ID chip, an IC tag, an ID tag, an RF tag, a wireless tag, an electronic tag, or a transponder) for RFID (Radio Frequency Identification).

Note that a semiconductor device here means that any device which can function by using a semiconductor property.

2. Description of the Related Art

With development of computer technologies and improvement of image recognition technologies, information identification utilizing media such as bar codes has spread widely and been used for identification of product data and the like. It is expected that the amount of information to be identified will further increase in the future. On the other hand, information identification utilizing bar codes is disadvantageous in that a bar code reader is required to be in contact with bar codes, and the amount of data stored in bar codes cannot be increased so much. Therefore, contactless information identification and increase in the storage capacity of media are required.

In view of the foregoing requirements, a contactless IC chip for RFID (hereinafter referred to as an IC chip) and a reader/writer device (also called an interrogator: hereinafter referred to as a reader/writer) have been developed. The IC chip has a memory circuit to store necessary information, and the information inside is read by a reader/writer using a contactless means, generally a wireless means. It is expected that practical application of an information processing device for reading information stored in such an IC chip will allow commercial distribution and the like to be simplified and made cheaper while ensuring high security.

In recent years, IC chips which can transmit/receive data without contact have become widely used in various fields in which automatic identification is required, such as management of valuable securities and merchandise. A card equipped with such an IC chip reads and writes data from/to an external device without contact, via an antenna with a shape adapted to the frequency band that is used when transmitting/receiving data.

A semiconductor device such as an IC chip is different from a semiconductor device which reads two-dimensional informational such as bar codes. A reader/writer is provided with an anti-collision function (also called collision avoidance function or merely anti-collision), so that the semiconductor device can read a signal from a plurality of IC chips (e.g., the ALOHA method which complies with the ISO 15693-3 standard). In addition, there is a method for performing an anti-collision function by providing a plurality of circuits in an IC chip. Reference 1 (Japanese Published Patent Application No. 2004-248310) discloses a data processing method in which a plurality of capacitors for resonance is provided and a resonance frequency value is kept constant, so that a function compatible with anti-collision between IC chips can be performed reliably.

SUMMARY OF THE INVENTION

However, in the data processing method for performing anti-collision as described in Reference 1, a logic circuit is formed using a circuit including a transistor over an IC chip. Accordingly, it has been necessary to remake an IC chip from the stage of mask design due to a change in specifications of a product accompanying a change of the kind or standard of a signal of a wireless means for each product. However, to remake an IC chip leads to increases in production cost and delays in production time. In the case where a remade IC chip malfunctions, further increases in production cost and delays in production time are a concern.

Thus, an object of the present invention is to provide a semiconductor device which includes an anti-collision function during or after production of an IC chip just by a change of a program stored in the semiconductor device, even when there is a change of specification of a product accompanying a change of the kind or standard of a signal of a wireless means for each product.

In view of the foregoing problems, the present invention provides a semiconductor device in which a memory element such as a ROM, a RAM or a CPU, and an arithmetic element are provided as a semiconductor device for performing anti-collision. When a transmission signal to outside or a reception signal from outside is in a collision condition (conflict condition), an anti-collision program stored in the memory element is read. Then, the anti-collision program is formed using an anti-collision routine, and the anti-collision routine is performed by the arithmetic element and the memory element. Note that an IC chip capable of wireless communication can be used as the semiconductor device.

A specific configuration according to the present invention is shown below.

One structure of a semiconductor device according to the present invention includes an arithmetic circuit and a circuit for transmitting/receiving a signal to/from outside. The arithmetic circuit includes a central processing unit, a random access memory, a read only memory, and a controller. The read only memory stores a program for processing collision avoidance in transmitting/receiving the signal to/from outside. The program is executed in the central processing unit, and thus the arithmetic circuit processes collision avoidance.

Another structure of a semiconductor device according to the present invention includes an arithmetic circuit and a circuit for transmitting/receiving a signal to/from outside. The arithmetic circuit includes a central processing unit, a random access memory, a read only memory, and a controller. The read only memory stores a program for processing collision avoidance in transmitting/receiving the signal to/from outside. The program includes a plurality of routines. The plurality of routines is processed in the central processing unit, and thus the arithmetic circuit processes collision avoidance.

Another structure of a semiconductor device according to the present invention includes an arithmetic circuit, an auxiliary arithmetic circuit, and a circuit for transmitting/receiving a signal to/from outside. The arithmetic circuit includes a central processing unit, a random access memory, a read only memory, and a controller. The read only memory stores a program for processing collision avoidance in transmitting/receiving the signal to/from outside. The program includes a plurality of routines, and the plurality of routines is processed in the central processing unit and processed in the auxiliary arithmetic circuit. Thus, the arithmetic circuit processes collision avoidance.

Another structure of a semiconductor device according to the present invention includes an arithmetic circuit and a circuit for transmitting/receiving a signal to/from outside. The arithmetic circuit includes a central processing unit, a random access memory, a read only memory, and a controller. The read only memory stores a program for processing collision avoidance in transmitting/receiving the signal to/from outside. The program includes a flag of the signal from outside, a first routine for determining a command, a second routine for determining a mask length code of the controller, a third routine for determining a cyclic redundancy check of the signal from outside, and a fourth routine for determining a slot of the signal from outside. The first to fourth routines are processed in the central processing unit. Thus, the arithmetic circuit processes collision avoidance.

Another structure of a semiconductor device according to the present invention includes an arithmetic circuit, an auxiliary arithmetic circuit, and a circuit for transmitting/receiving a signal to/from outside. The arithmetic circuit includes a central processing unit, a random access memory, a read only memory, and a controller. The read only memory stores a program for processing collision avoidance in transmitting/receiving the signal to/from outside. The program includes a flag of the signal from outside, a first routine for determining a command, a second routine for determining a mask length code of the controller, a third routine for determining a cyclic redundancy check of the signal from outside, and a fourth routine for determining a slot of the signal from outside. The first to fourth routines are processed in the central processing unit and processed in the auxiliary arithmetic circuit. Thus, the arithmetic circuit processes collision avoidance.

In the present invention, the third routine may be processed in the auxiliary arithmetic circuit.

In the present invention, the signal from outside may have a structure including a start code of a frame, a flag code, a command code, a data code, a cyclic redundancy check code, and an end code of a frame.

In the present invention, the controller may have a structure including a CPU interface, a control register, a code extracting circuit, and an encoding circuit.

In the present invention, the control register may determine the start code of the frame, and the program for processing collision avoidance is executed.

In the present invention, the circuit for transmitting/receiving a signal to/from outside may have a structure including an antenna, a resonant circuit, a power supply circuit, a reset circuit, a clock generating circuit, a demodulation circuit, a modulation circuit, and a power source managing circuit.

With an IC chip having a collision avoidance function of the present invention, it is not necessary to remake the IC chip from a stage of mask design due to a change of specification accompanying a change of the kind or standard of a signal of a wireless means for each product. Accordingly, production cost and production time can be reduced. In addition, there is no concern that an IC chip remade due to a change in the mask design will malfunction.

In addition, when a conventional IC chip having an exclusive collision avoidance function is manufactured, the IC chip is equipped with a circuit provided with a collision avoidance function. However, according to the present invention, a read only memory stores a collision avoidance function as a program, so the occurrence of malfunctions of IC chips can be reduced, since the read only memory is easy to make compared with a circuit provided with a collision avoidance function.

DETAILED DESCRIPTION OF THE INVENTION

Embodiment Mode

Figure 1:
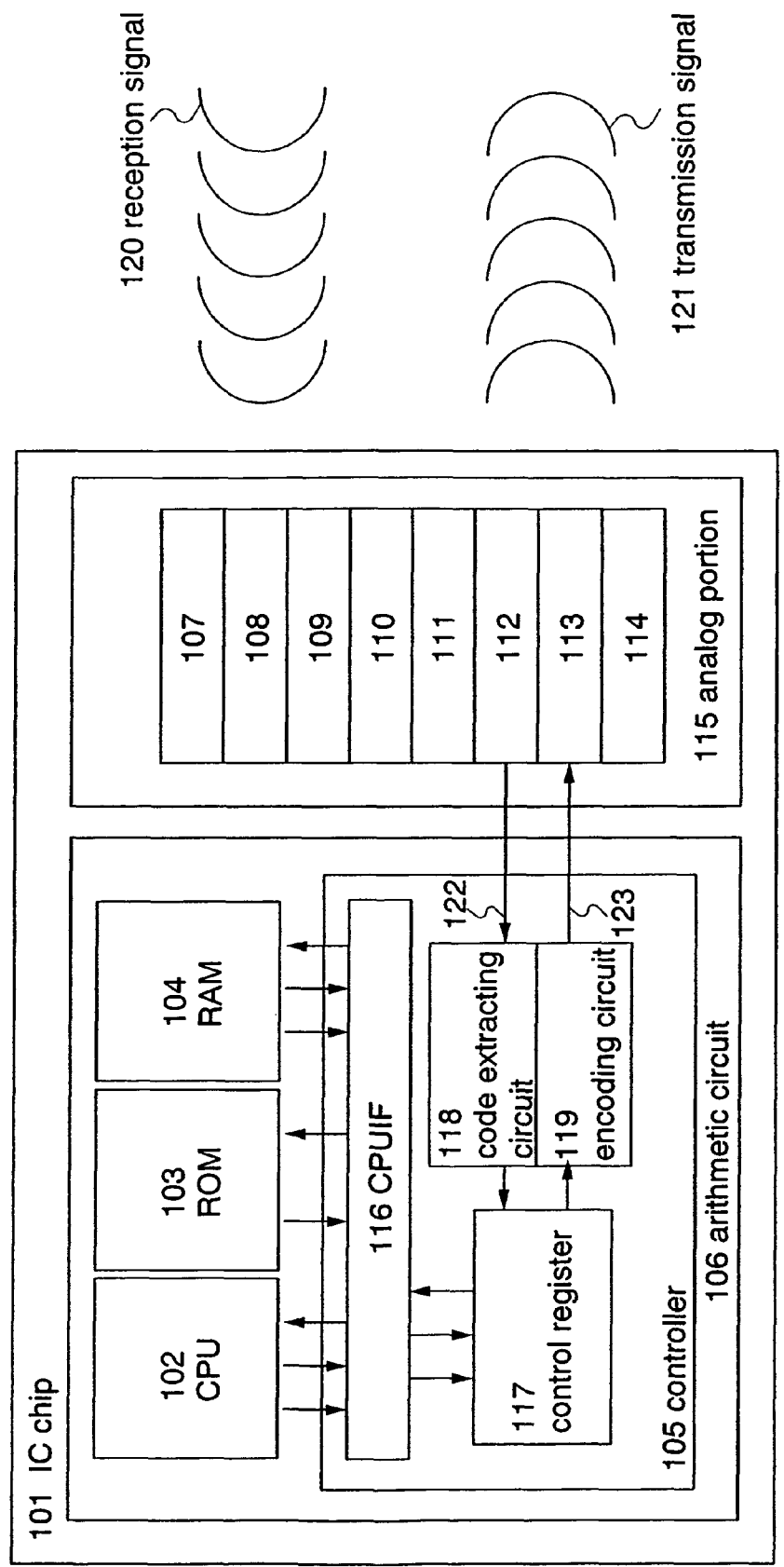
FIG. 1 is a block diagram showing a semiconductor device according to the present invention.

Hereinafter, embodiment modes of the present invention will be described with reference to the drawings. However, it is to be easily understood by those skilled in the art that the present invention can be implemented in many different ways, and modes and details herein disclosed can be modified in various ways without departing from the purpose and the scope of the present invention. Therefore, the present invention should not be interpreted as being limited to the description of the embodiment modes given below. Note that in the drawings of the embodiment modes, components which are the same or which have the same functions are denoted by the same reference numerals, and repetitious explanation thereof is omitted.

Embodiment Mode 1

A device configuration for realizing an anti-collision function of the present invention and a flowchart are described in this embodiment mode.

FIG. 1 shows a block diagram of an IC chip which is to be equipped with an anti-collision function of the present invention.

In FIG. 1, an IC chip 101 includes an arithmetic circuit 106 and an analog portion 115. The arithmetic circuit 106 includes a CPU (also called a Central Processing Unit) 102, a ROM (also called a Read Only Memory) 103, a RAM (also called a Random Access Memory) 104, and a controller 105. The analog portion 115 includes an antenna 107, a resonant circuit 108, a power supply circuit 109, a reset circuit 110, a clock generating circuit 111, a demodulation circuit 112, a modulation circuit 113, and a power source managing circuit 114. The controller 105 includes a CPU interface (CPUIF)

116, a control register 117, a code extracting circuit 118, and an encoding circuit 119. Note that in FIG. 1, although a reception signal 120 and a transmission signal 121 are shown differently as communication signals for simplification of description, both waveforms are actually overlapped with each other, and transmitted/received between the IC chip 101 and a reader/writer device. The reception signal 120 is received by the antenna 107 and the resonant circuit 108, and then demodulated by the demodulation circuit 112. The transmission signal 121 is modulated by the modulation circuit 113 and then transmitted by the antenna 107. Note that the reception signal and the transmission signal are expressions that have the IC chip side as the subject. The IC chip receives a signal from outside and transmits a signal to outside. In this specification, the IC chip receives a signal from the reader/writer, in other words, a signal transmitted by the reader/writer is called a signal to outside, and operations of the IC chip receiving the signal from outside and the reader/writer transmitting the signal to outside, are called transmission/reception of the signal to/from outside.

Note that the ROM stores data of a program (hereinafter referred to as an anti-collision program) which functions when the received data received from the reader/writer is anti-collision, and the RAM stores processing data of when the program functions. As a ROM, a mask ROM (Read Only Memory) or the like can be used. As a RAM, a static type memory (SRAM), a dynamic type memory (DRAM), or the like can be used. Specifically, data of the anti-collision program includes a routine (hereinafter referred to as an anti-collision routine) for a plurality of anti-collisions which performs the anti-collision function between the reader/writer and the IC chip.

Figure 2A:
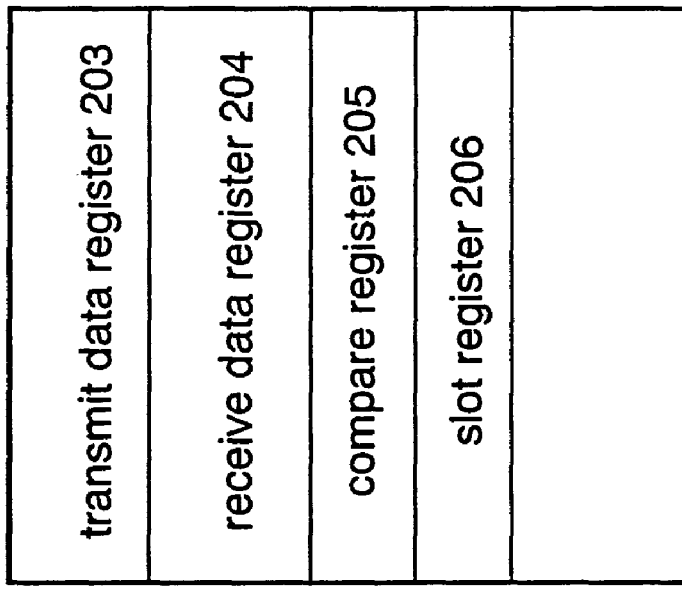
FIGS. 2A and 2B are each block diagrams of a memory in a semiconductor device according to the present invention.
Figure 2B:
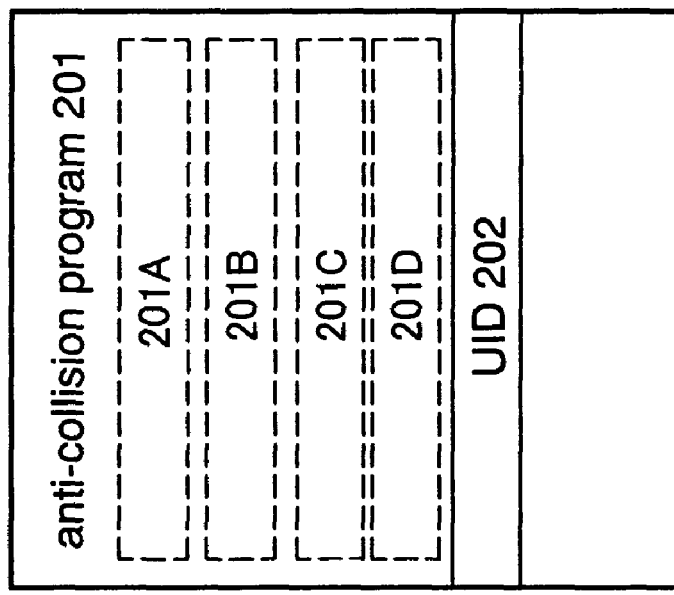

FIGS. 2A and 2B show address spaces of the ROM 103 and the RAM 104, respectively. The ROM 103 stores an anti-collision program 201 and a UID (Unique Identifier) 202 as an individual identification number. The anti-collision program 201 includes a command decision routine 201A, a mask length decision routine 201B, a CRC decision routine 201C (Cyclic Redundancy Check), and the number of IC chips that is acceptable to the anti-collision program decision routine (hereinafter, the number of IC chips decision routine) 201D. The command decision routine 201A refers to a program code including a function of performing a decision process of a particular command. The mask length decision routine 201B refers to a program code including a function of performing a process for deciding a mask length. The CRC decision routine 201C refers to a program code including a function of performing a process for deciding the CRC. The number of IC chips decision routine 201D refers to a program code having a function of performing a process for deciding whether there is one IC chip or N number s of IC chips (N is an integer number 2 or more). These plural routines are described below in more detail.

The RAM 104 includes a transmit data register 203, a receive data register 204, a compare register 205, and a slot register 206. The transmit data register 203 has a function of storing data transmitted by the IC chip. The receive data register 204 has a function of storing data received by the IC chip. The compare register 205 has a function of storing data of the UID 202. The slot register 206 has a function of storing data of the UID which is masked. The RAM 104 has a small amount of information compared with the ROM 103; therefore, the area of the RAM 104 is small.

Figure 3:
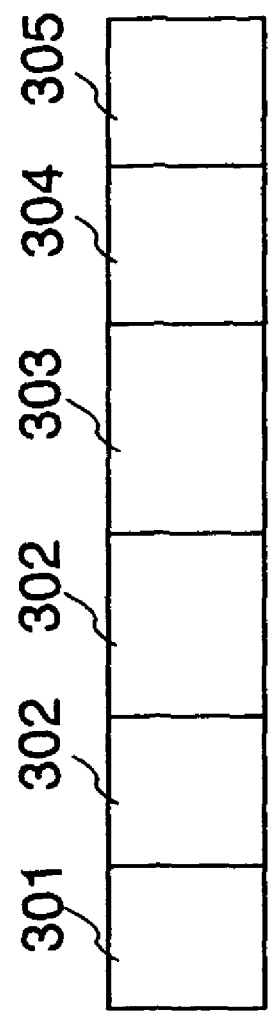
FIG. 3 is a block diagram of a signal in the present invention.

FIG. 3 shows a structure of a signal transmitted from the reader/writer to the IC chip, in other words, a signal received by the IC chip. A reception signal is a signal including a SOF 301 (Start Of Frame), a flag 302, a command 303, data 304, a CRC 305, and an EOF 306 (End Of Frame). The SOF 301 and the EOF 306 show merely a signal start and a signal termination, respectively. The flag 302 includes reading restriction information from the reader/writer side, such as "read the number of IC chips that is acceptable to the anti-collision program", in the case where the reader/writer reads a kind of modulation such as ASK (Amplitude shift keying)or FSK (Frequency shift keying), or N numbers of IC chips at the same time. The command 303 is a signal prescribing whether the reader/writer reads the IC chip, and when a signal is read, the command 303 includes the information "inventory=1", whereas in a state other than that (an instruction such as to stop reading), the command 303 includes the information "inventory≠1". The data 304 includes information such as the UID. The CRC 305 includes information on a unique code which is generated from data to prevent misidentification of data.

Figure 4:
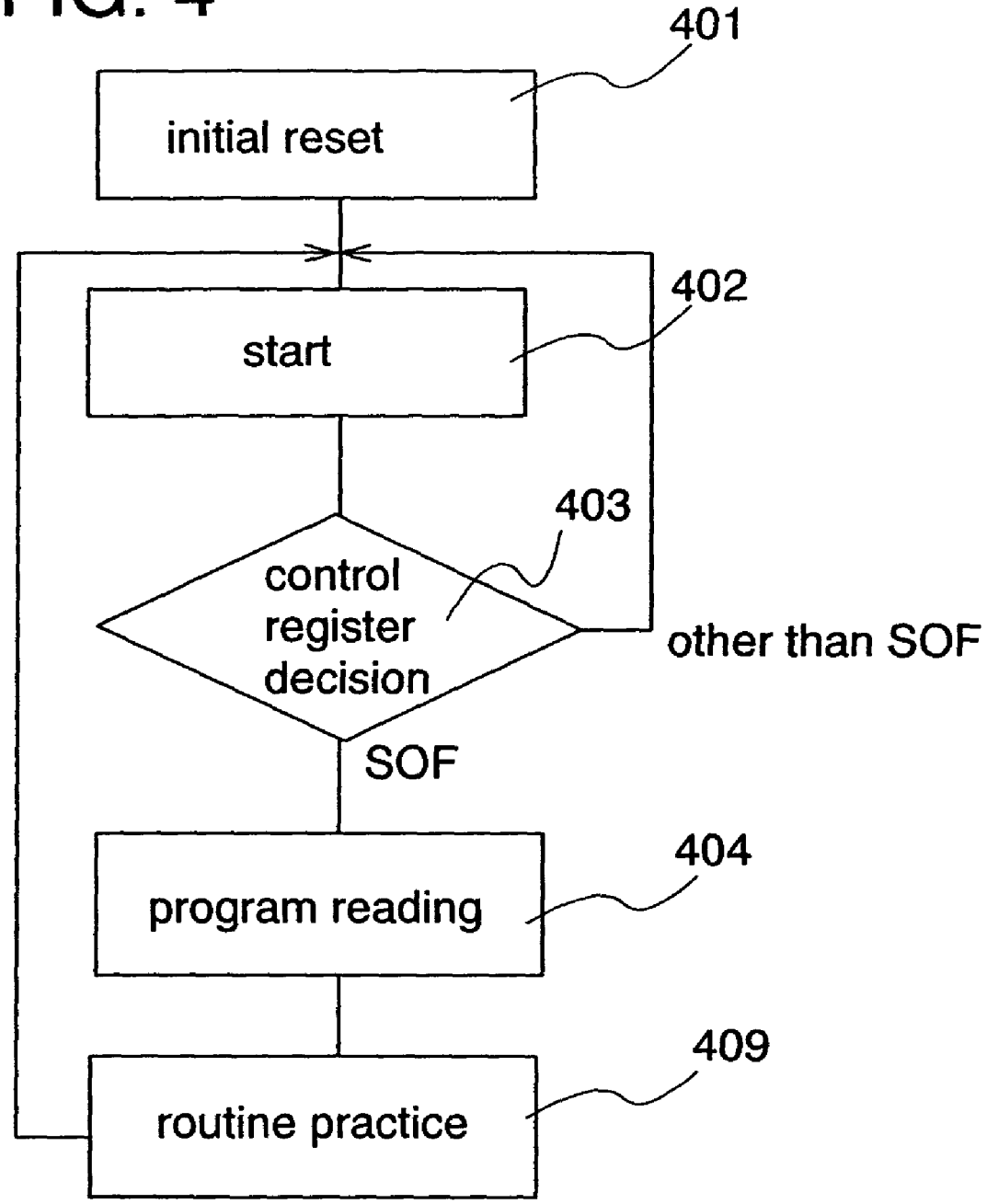
FIG. 4 is a flow chart diagram showing an anti-collision mechanism of the present invention.

Next, operation of the program of the anti-collision function in the IC chip in FIG. 1 is described with reference to a flow chart of FIG. 4.

First, the reset circuit 110 included in the IC chip resets the arithmetic circuit 106 after the reception signal 120 is received (an initial reset: step 401). When reset is performed, the demodulation circuit 112 starts demodulation of the reception signal 120, and outputs demodulated received data 122 to the code extracting circuit 118. The code extracting circuit 118 extracts a control code from the demodulated received data 122 and writes the control code to the control register 117.

The CPU 102 included in the IC chip starts an operation (a start 402) when a signal from the code extracting circuit is written to the control register 117. The CPU 102 reads an anti-collision program from the ROM 103 (a program reading: step 404), and performs an anti-collision routine in the anti-collision program (a routine practice: step 409) when a control code in the control register 117 includes a SOF (Start Of Frame) (a control register decision: step 403). On the other hand, a state returns to a state after the initial reset 401 when the control code of the control register 117 does not include the SOF. Note that the CPU 102 returns to the state after the initial reset 401 after the anti-collision routine is performed. Note that in the present invention, a clock frequency of the CPU 102 for performing an anti-collision program is preferably 1 MHz or higher when an 8-bit CPU is used, and more preferably 100 MHz or higher. Note also that a process in the CPU in a semiconductor device of the present invention may be divided by a plurality of CPUs, and may perform pipeline processing. In the present invention, a plurality of CPUs is provided and pipeline processing is performed, so that an anti-collision program can be performed at high speed even when a CPU having lower clock frequency is used.

Next, the anti-collision routine in the anti-collision program to realize the anti-collision function in the IC chip in FIG. 1 is described with reference to FIGS. 5 to 9.

Figure 5:
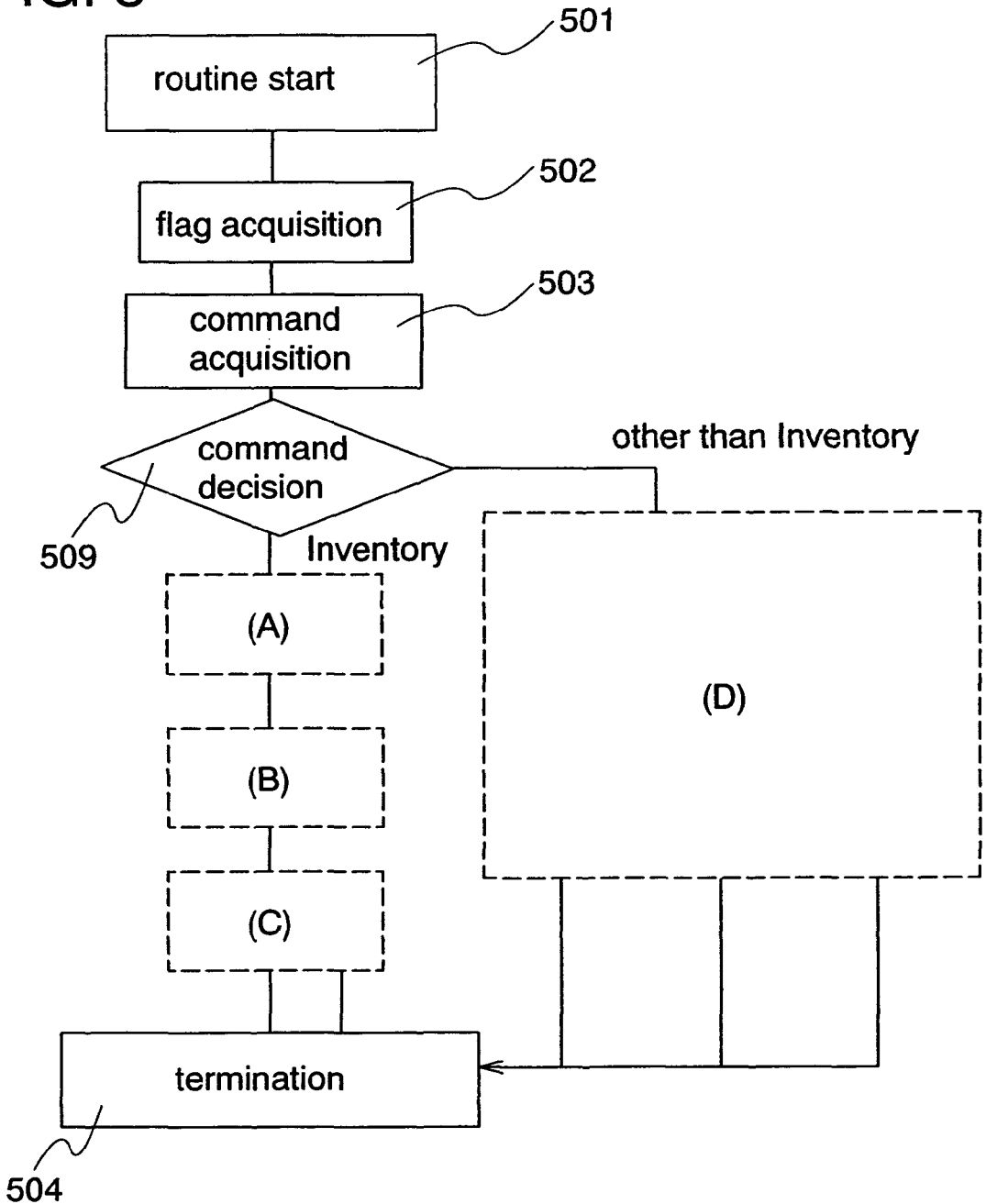
FIG. 5 is a flow chart diagram showing an anti-collision mechanism of the present invention.

First, an operation of an anti-collision routine is described with reference to a flow chart shown in FIG. 5. The CPU 102 reads an anti-collision program from the ROM 103 and starts an anti-collision routine (a routine start: step 501). The CPU 102 reads a flag code of the control register 117 and writes the flag code in the RAM 104 (a flag acquisition: step 502). Next, the CPU 102 reads a command code of the control register 117 and writes the command code to the RAM 104 (a command acquisition: step 503). The CPU 102 can make a process branch (a command decision routine: step 509) into Inventory and other than the Inventory depending on a kind of a command code (FIGS. 5A, 5B, 5C, and 5D), and can further perform a plurality of routines. At last the CPU 102 terminates a plurality of routines to perform anti-collision (a termination: step 504).

Next, the details of a process depending on the command code in the IC chip in FIG. 1 are described with reference to a flow chart of FIG. 6.

Figure 6:
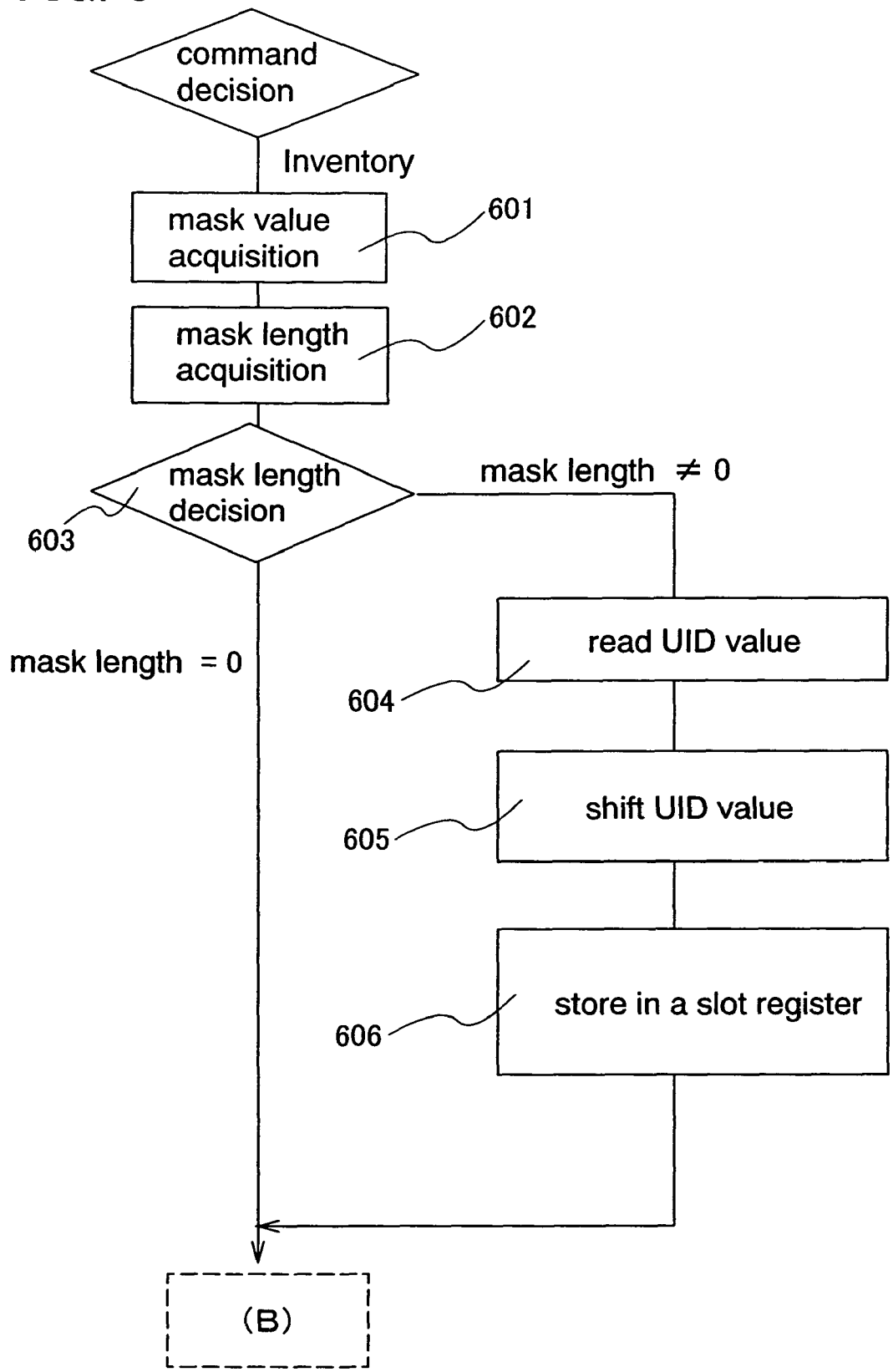
FIG. 6 is a flow chart diagram showing an anti-collision mechanism of the present invention.

FIG. 6 shows a flow chart of an Inventory command (FIG. 5A). The CPU 102 reads a mask value code of the control register 117 and writes the mask length code to the RAM 104 (a mask value acquisition: step 601). The CPU 102 reads a mask length code of the control register 117 and writes the mask length code to the RAM 104 (a mask length acquisition: step 602). The CPU 102 makes a process branch depending on a value of the mask length code (mask length decision: step 603). Only when the value of the mask length code is other than "0", the CPU 102 reads a UID value (read UID value: step 604), shifts the UID value to the right by the mask length code (shift UID value: step 605), and stores the shifted UID value for a logN/log2 bit from the least significant bit (truncate the numbers after the decimal point, in this embodiment mode, for 4 bits) in a slot register (store the shifted UID in a slot register: 606).

Figure 7:
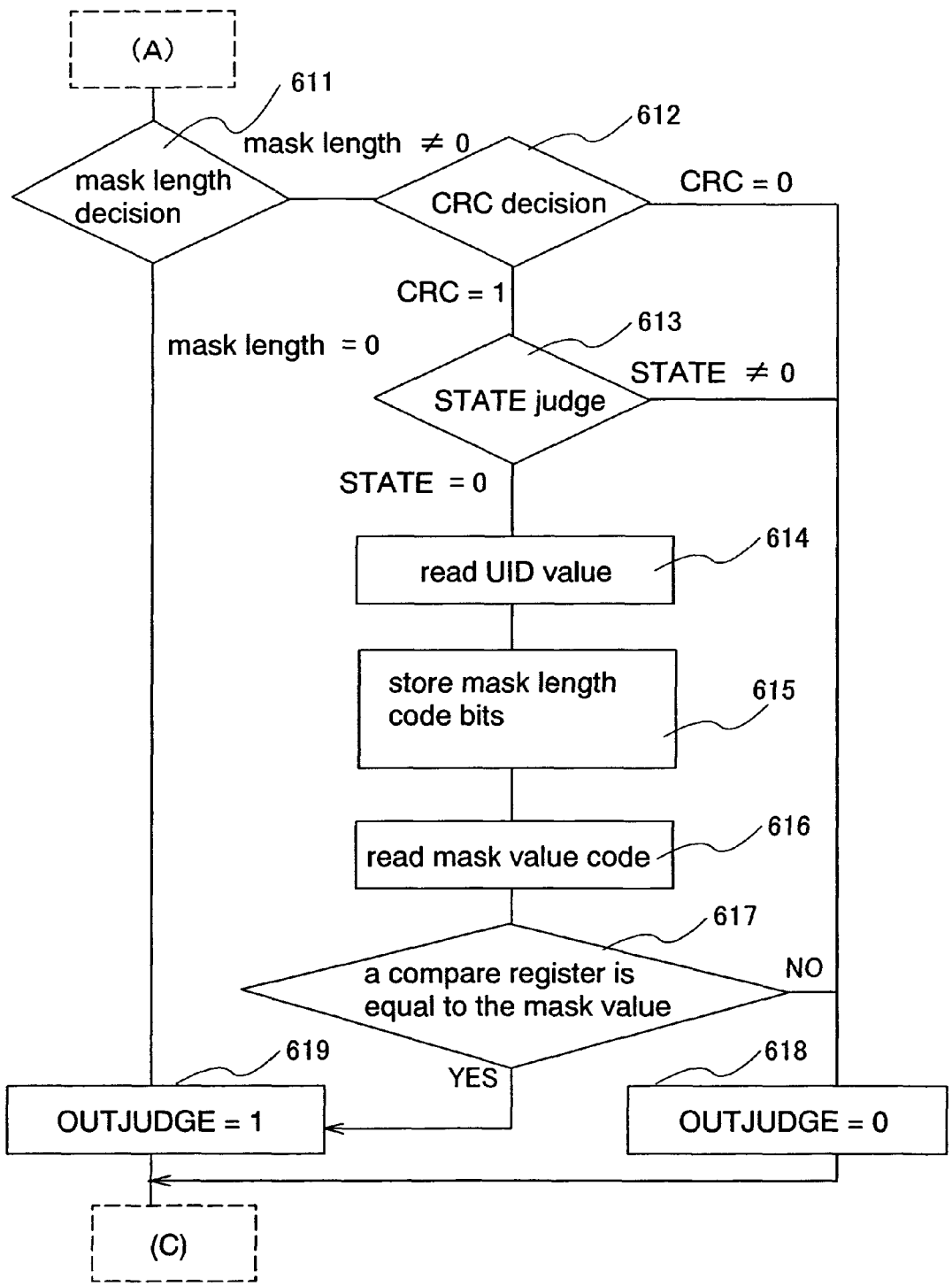
FIG. 7 is a flow chart diagram showing an anti-collision mechanism of the present invention.

Next, FIG. 7 shows a flow chart of a mask length decision (FIG. 5B). The CPU 102 makes a process branch (a mask length decision routine: step 611) by the value of the mask length code. The CPU 102 makes an OUTJUDGE flag "1" when the mask length code is "0" (OUTJUDGE=1: step 619). On the other hand, the CPU 102 makes a process branch by a value of a CRC flag when the mask length code is other than 0 (CRC decision: 612). The CPU 102 makes the OUTJUDGE flag "0" when the CRC flag is "0" (OUTJUDGE=0: step 618). The CPU 102 makes a process branch by the value of an STATE flag when the CRC flag is "1" (STATE judge: step 613). The CPU 102 makes the OUTJUDGE flag "0" when the STATE flag is other than "0" (OUTJUDGE=0: step 618). The CPU 102 reads the UID value and stores bits corresponding to a mask length code and determined by regarding the least significant bit of the UID code as a base point of the UID value (read UID value: step 614), in the compare register when the STATE flag is "0" (store mask length code bits: step 615). Finally, the CPU 102 reads the mask value code (read mask value code: step 616) and compares the bits corresponding to a mask length code and determined by regarding the least significant bit of the UID code as a base point with the compare register (a compare register=the mask value: step 617). The OUTJUDGE flag is "1" when the mask length code from the least significant bit corresponds to the compare register (OUTJUDGE=1: step 619). On the other hand, the OUTJUDGE flag is "0" when the mask length code from the least significant bit does not correspond to the compare register (OUTJUDGE=0: step 618). It is to be noted that the CRC flag has a data "CRC flag is 1" when the CRC 305 of the reception signal corresponds to a CRC obtained by the calculation of the CPU 102 using the data 303, and that the CRC flag has a data "CRC flag is 0" when the CRC 305 of the reception signal does not correspond to the CRC obtained by the calculation of the CPU 102 using the data 303. Further, the OUTJUDGE flag is a signal that prescribes whether each of the IC chips runs a response operation to the reader/writer or not. The OUTJUDGE flag has a data "OUTJUDGE=1" in the case where the UID value is written to the control register 117 in order to run the response operation, and the OUTJUDGE flag has a data "OUTJUDGE=0" in other cases. Further, the STATE flag is a signal that prescribes whether each of the IC chips runs a response operation to the reader/writer or not regardless of the data of the OUTJUDGE flag. The STATE flag has a data "STATE=0" in the case where the response operation is run, and the STATE flag has a data "STATE≠0" (including "STATE=1") in other cases. Flag codes such as the CRC flag, the OUTJUDGE flag, and the STATE flag are processed using an area other than an area used for the transmit data register 203, the receive data register 204, the compare register 205, and the slot register 206 included in the RAM 104.

The CPU 102 reads the flag code, makes a process branch into N slots (N=1 in this embodiment) and 1 slot depending on a kind of the flag code, and performs either process.

Figure 8:
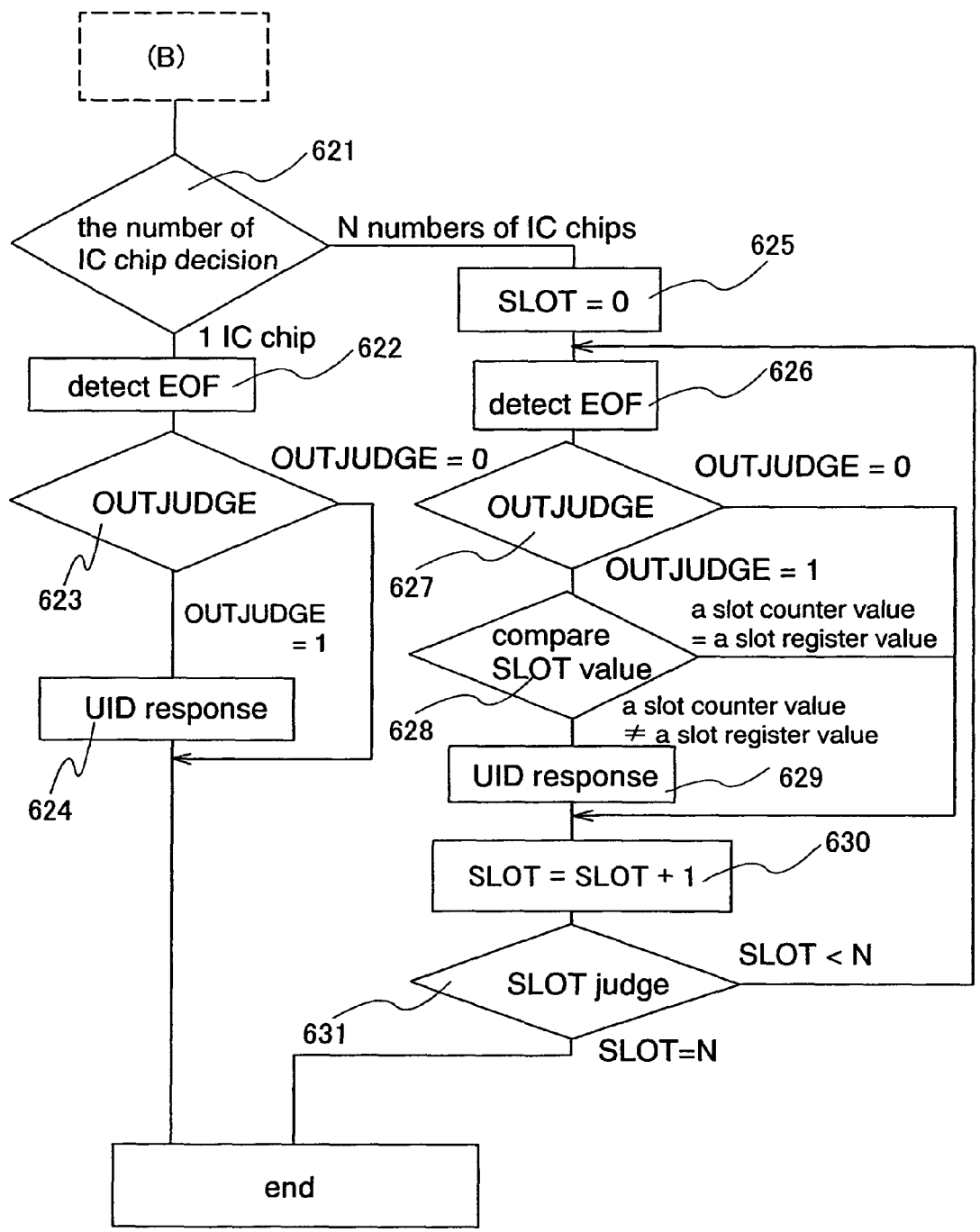
FIG. 8 is a flow chart diagram showing an anti-collision mechanism of the present invention.

Next, FIG. 8 shows a flow chart of the number of IC chips decision (the number of IC chips decision: step 621) (FIG. 5C). When the CPU 102 starts a process of 1 slot, the CPU 102 waits until the CPU 102 detects that a state of the control register 117 is EOF (detect EOF: step 622), and then, when the OUTJUDGE flag is "1" (OUTJUDGE: step 623), the CPU 102 writes the UID value to the control register 117 (UID response: step 624), starts a reply operation, and terminates the anti-collision routine. When the CPU 102 starts a process of 16 slot, "0" is substituted for a slot counter (SLOT=0: step 625). Next, the CPU 102 waits until the CPU 102 detects that the state of the control register 117 is EOF (detect EOF: step 626), and then, only when the OUTJUDGE flag is 1 (OUTJUDGE: step 627) and a slot counter value is equal to a slot register value (compare SLOT value: step 628), the CPU 102 writes the UID value to the control register 117 and starts the reply operation (UID response: step 629). The CPU 102 increases the slot counter value by 1 (SLOT=SLOT+1: step 630, SLOT judge: 631). The CPU 102 terminates the anti-collision routine when the slot counter value is equal to 16, whereas the CPU 102 waits until when the CPU 102 detects that the state of the control register 117 is EOF again when the slot counter value is smaller than 16 (detect EOF: step 626). It is to be noted that the SLOT are processed using an area other than an area used for the transmit data register 203, the receive data register 204, the compare register 205, and the slot register 206 included in the RAM 104.

Figure 9:
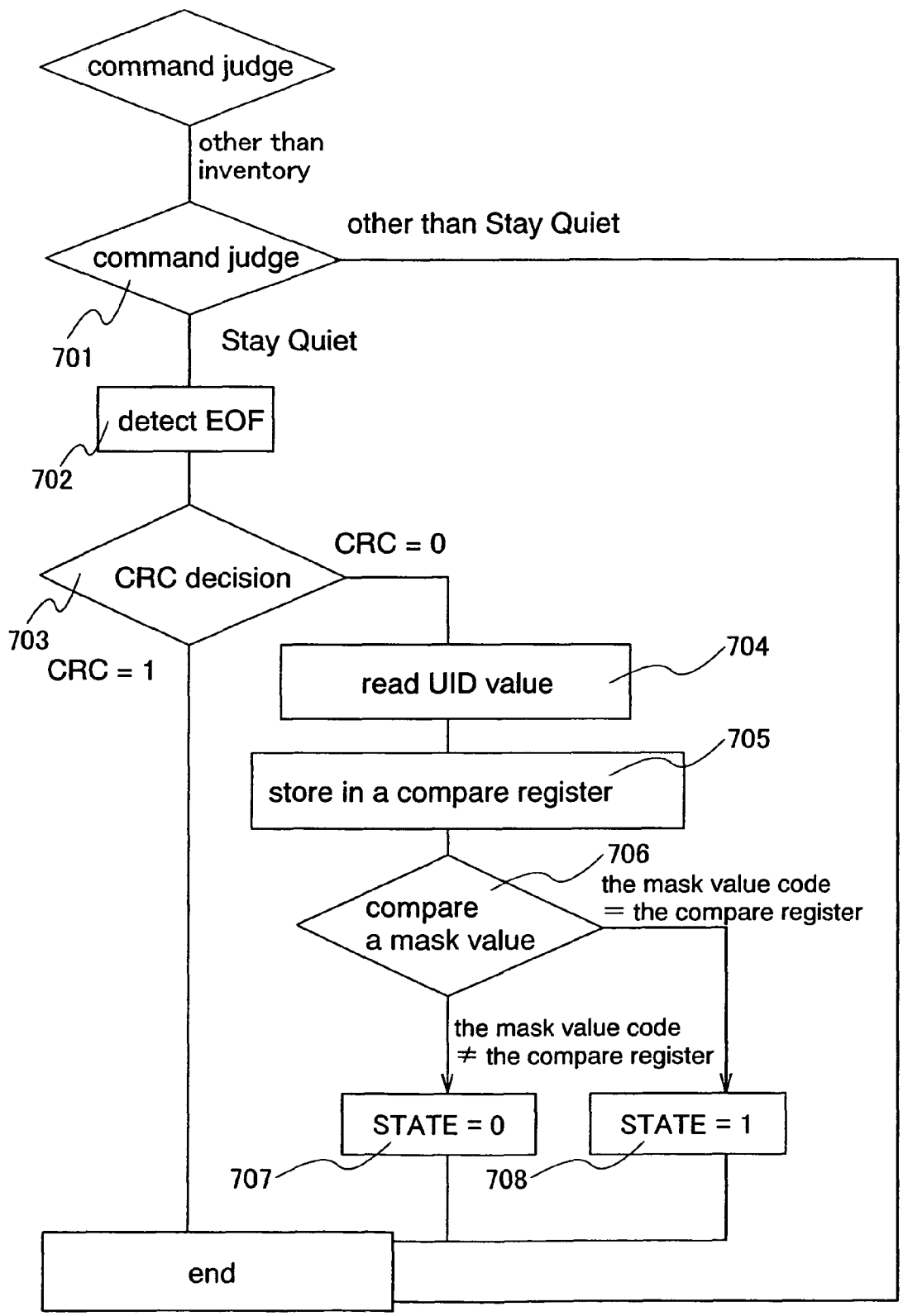
FIG. 9 is a flow chart diagram showing an anti-collision mechanism of the present invention.

FIG. 9 shows a flow chart of a command other than Inventory (FIG. 5D). The CPU 102 can make a process branch Stay Quiet and other than Stay Quiet by a kind of the command code (command decision: step 701) and can perform either routine.

The flow chart of FIG. 9 is described. When the CPU 102 starts a process of a Stay Quiet command, the CPU 102 waits until the CPU 102 detects that a state of the control register 117 is EOF (detect EOF: step 702). The CPU 102 makes the STATE flag "0" when the CRC flag is "0" and terminates the anti-collision routine. On the other hand, the CPU 102 reads the UID value (read UID value: step 704) and stores the UID value in the compare register (store in a compare register: step 705) when the CRC flag is "1". The CPU 102 reads the mask value code and compares with the compare register (compare a mask value: step 706), when the mask value code does not correspond with the compare register, the STATE flag is "0" (STATE=0: step 707), and the anti-collision routine is terminated. When the mask value code corresponds with the compare register, the STATE flag is "1" (STATE=1: step 708) and the anti-collision routine is terminated. In addition, the CPU 102 terminates an anti-collision routine other than a process of the Stay Quiet command.

In the IC chip including the anti-collision function by using such a mode as described above, by the change of specification accompanying a change of the kind or standard of a signal of a wireless means for each product, it is not necessary to remake an IC chip from the stage of mask design thereof. Accordingly, the change of specification accompanying a change of the kind or standard of a signal of a wireless means for each product can be corresponded by merely change of the anti-collision program, and production cost and production time can be reduced. In addition, there is no concern that a remade IC chip has malfunction by the change of the mask design.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

Note that this embodiment mode can be implemented by being freely combined with any parts of other embodiment modes in this specification.

Embodiment Mode 2

Embodiment Mode 1 shows the structure in which the IC chip can perform the anti-collision function with the anti-collision program, including a plurality of routines to perform the anti-collision function, stored in the ROM. This embodiment mode describes a device configuration and a circuit configuration for realizing an anti-collision function which is different from Embodiment Mode 1. Since a flow chart is similar to that of the embodiment mode, description is made with reference to the drawings described in the embodiment mode if necessary.

Figure 10:
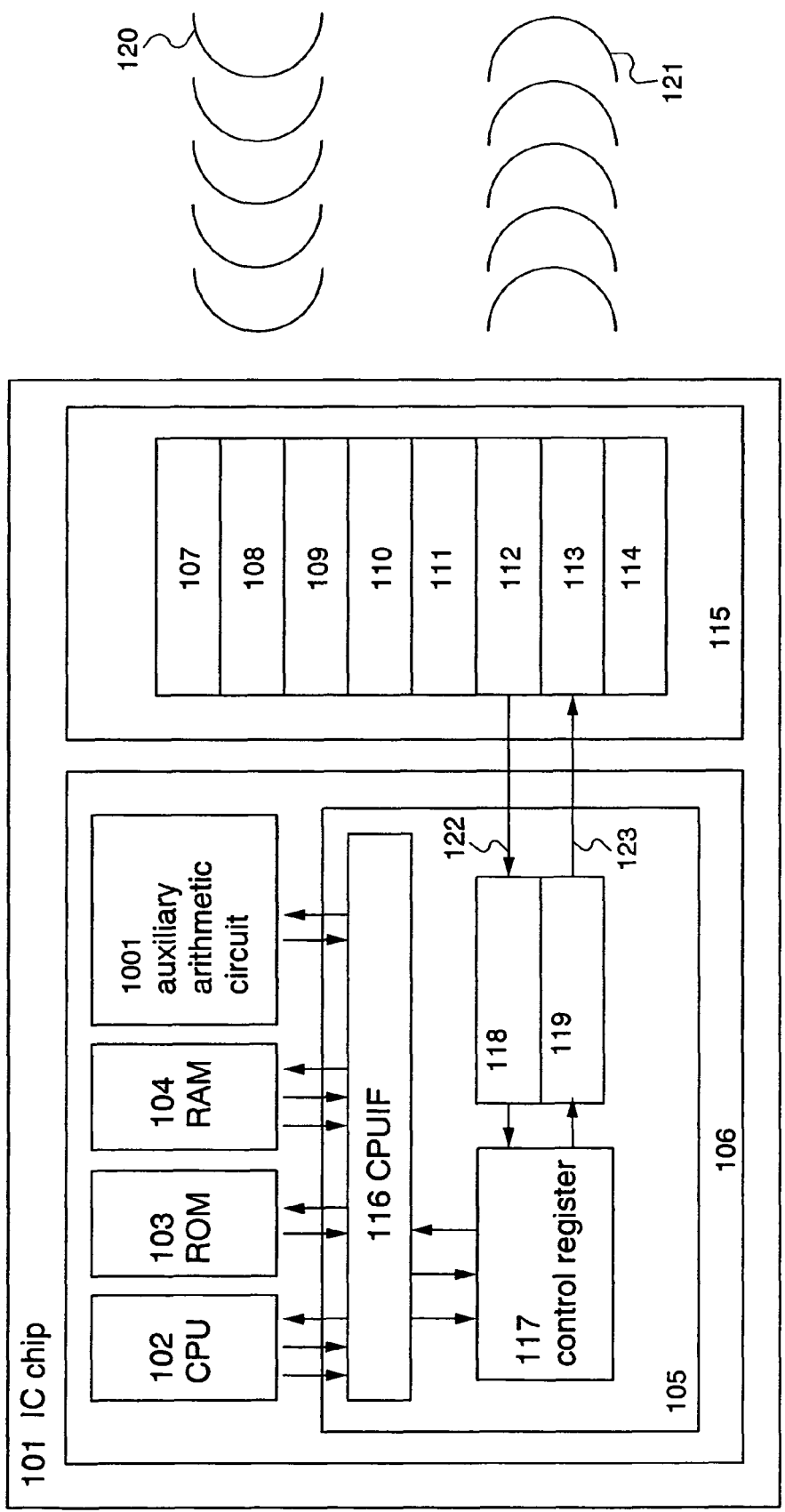
FIG. 10 is a block diagram showing a semiconductor device according to the present invention.

FIG. 10 shows a block diagram of an IC chip which is an object including an anti-collision function of the present invention. FIG. 10 shows a block diagram in which an auxiliary arithmetic circuit 1001 is added to the block diagram of the IC chip of FIG. 1 in Embodiment Mode 1, and which includes, the same as FIG. 1, the arithmetic circuit 106 having the CPU 102, the ROM 103, the RAM 104 and the controller 105, and the analog portion 115 having the antenna 107, the resonant circuit 108, the power supply circuit 109, the reset circuit 110, the clock generating circuit 111, the demodulation circuit 112, the modulation circuit 113 and the power source management circuit 114. The controller 105 includes the CPU interface (CPUIF) 116, the control register 117, the code extracting circuit 118, and the encoding circuit 119.

Although such a process of an anti-collision function in an IC chip is similar to that of Embodiment Mode 1, a part of the process is performed in the auxiliary arithmetic circuit 1001.

A preferable circuit mounted on the auxiliary arithmetic circuit 1001 includes a shift arithmetic circuit or a CRC arithmetic circuit. In particular, a right shift circuit is suitable for a right shift (step 605) of the UID value in FIG. 6, whereas a CRC arithmetic circuit is suitable for a CRC decision (step 612) in FIG. 7 and a CRC decision (step 703) in FIG. 9.

Figure 11:
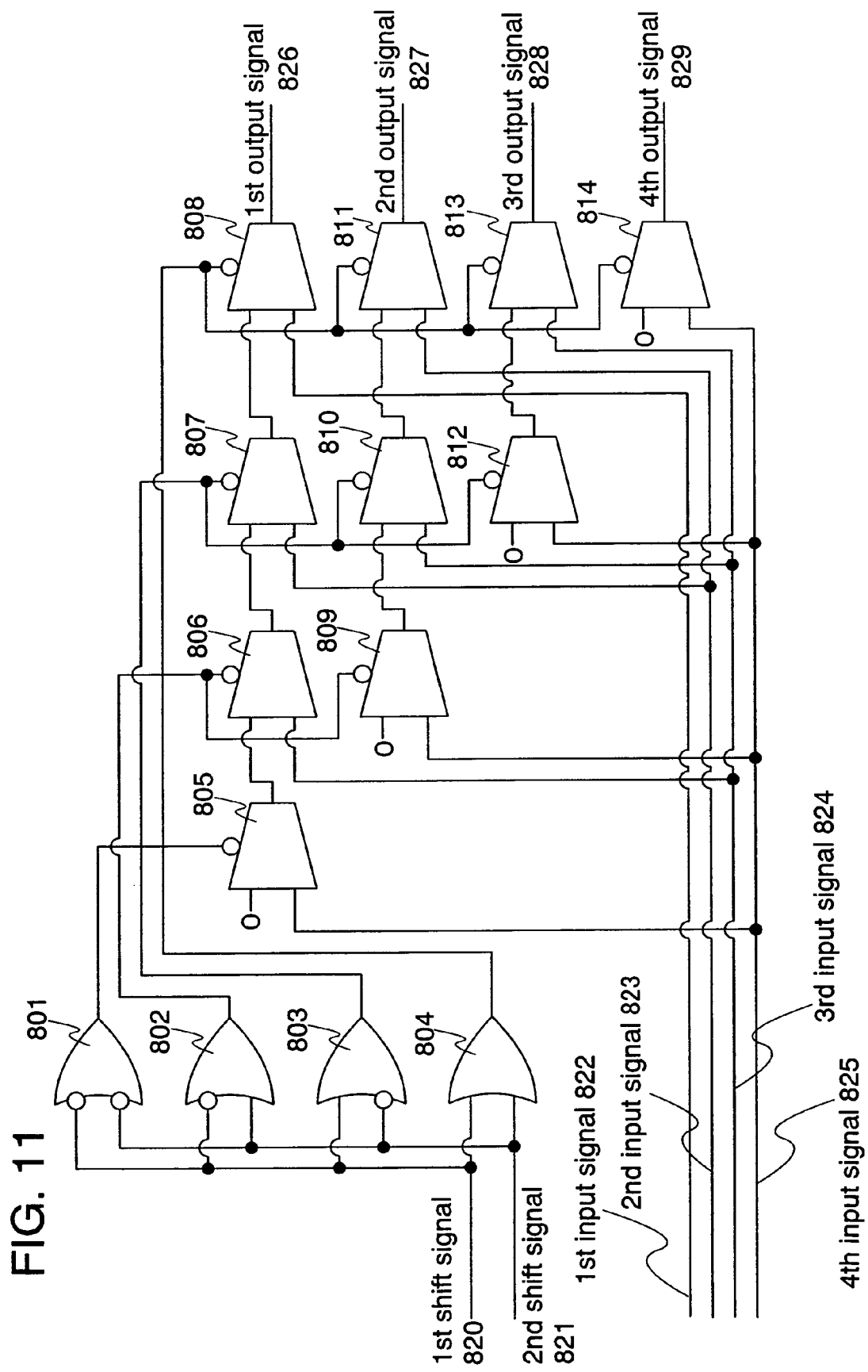
FIG. 11 is a block diagram showing a semiconductor device according to the present invention.

Next, FIG. 11 shows a circuit configuration of a right shift circuit which performs 4-bit parallel input-parallel output, which is an example of a shift arithmetic circuit. The right shift circuit includes a two-input selector and an OR circuit. The right shift circuit shifts an input signal to the right by a shift signal value and outputs the input signal as an output signal. This circuit configuration can be applied to a circuit including a left shift or a wider bit-width input without being limited to the right shift or the bit width of 4 bits.

In FIG. 11, a 4-bit input signal including a first input signal 822, a second input signal 823, a third input signal 824, and a fourth input signal 825 is inputted to selectors 805 to 814. A 2-bit shift signal including a first shift signal 820 and a second shift signal 821 is inputted to OR circuits 801 to 804, and is a selector selection signal which controls the selectors 805 to 814.

An operation of the 4-bit parallel input-parallel output which is an example of this embodiment mode is described below. Note that an operation when an input signal is "1111" in binary and a shift signal is "01" in binary is described.

When the shift signal is "01", only the OR circuit 803 outputs "1", whereas the other circuits output "0". The selectors 807, 810 and 812 which receive "1" outputted by the OR circuit 803 output "1" which is the second input signal 823, "1" which is the third input signal 824, and "1" which is the fourth input signal 825 to the selectors 808, 811 and 812, respectively. The selectors 808, 811, 813 and 814 which are operated by "0" outputted by the OR circuit 804 output "1" which is a value outputted by the selector 807, "1" which is a value outputted by the selector 810, "1" which is a value outputted by the selector 812, and "0" which is set in advance to a first output signal 826, a second output signal 827, a third output signal 828, and a fourth output signal 829, respectively.

Therefore, the output signal is "0111" in binary and is a value in which an input signal "1111" is 1-bit shifted to the right.

Figure 12:
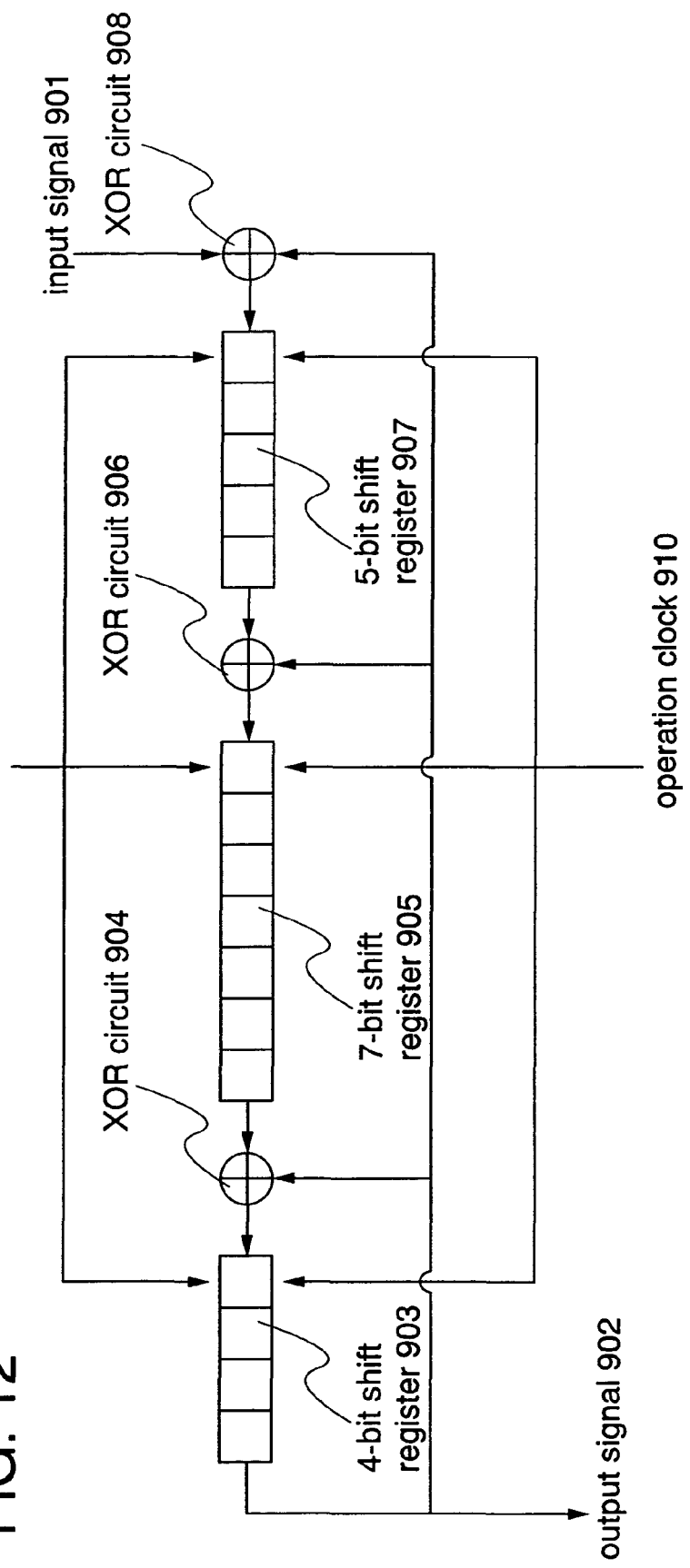
FIG. 12 is a block diagram showing a semiconductor device according to the present invention.

Next, FIG. 12 shows a configuration of a CRC-16 receiver circuit which is an example of the CRC arithmetic circuit. The CRC-16 receiver circuit is a cyclic shift register circuit including a shift register and an XOR circuit. The CRC-16 receiver circuit divides an input signal by a CRC generator polynomial $(X^{16}+X^{12}+X^5+1)$. The result of division shows that the input signal is correct if there is no reminder, while the input signal is wrong if there is a reminder. This circuit configuration can be applied to a CRC-CCIT circuit, a CRC-12 circuit, or a CRC-32 circuit without being limited to the CRC-16 receiver circuit.

An operation of the CRC-16 receiver circuit which is an example of this embodiment mode is described below.

Shift registers 903, 905 and 907 each receive a reset signal 911 and the shift registers 903, 905 and 907 are set at "0". When a first bit of an input signal 901 having an arbitrary bit is inputted to an XOR circuit 908 at a timing of an operation clock 910, an XOR operation is performed using the first-bit value and "0" which is outputted from a 4-bit shift register 903, and a result is inputted to a 5-bit shift register 907. Then, the XOR operation is performed using the first bit after four clocks and "0" which is outputted from the 4-bit shift register 903 again in an XOR circuit 906, and a result is inputted to a 7-bit shift register 905. Such a process is repeated, and the first bit passes through an XOR circuit 904 and the 4-bit shift register 903, and the first bit is outputted as an output signal 902.

Note that the aforementioned process is the same as dividing the input signal 901 having an arbitrary bit by a CRC generator polynomial $(X^{16}+X^{12}+X^5+1)$.

A circuit having these functions is included in the auxiliary arithmetic circuit 1001 and operated by an instruction of the CPU 102, so that the circuit can process faster than the routine mounted on the ROM 103.

In the IC chip including the anti-collision function by using such a mode as described above, by the change of specification accompanying a change of the kind or standard of a signal of a wireless means for each product, it is not necessary to remake an IC chip from the stage of mask design thereof. Accordingly, the change of specification accompanying a change of the kind or standard of a signal of a wireless means for each product can be corresponded by merely change of the anti-collision program, and production cost and production time can be reduced. In addition, there is no concern that a remade IC chip has malfunction by the change of the mask design.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

Note that this embodiment mode can be implemented by being freely combined with any parts of other embodiment modes in this specification.

Embodiment Mode 3

In this embodiment mode, a mode of an IC chip formed by a thin film transistor formed over an insulating substrate is described.

Figure 13A:
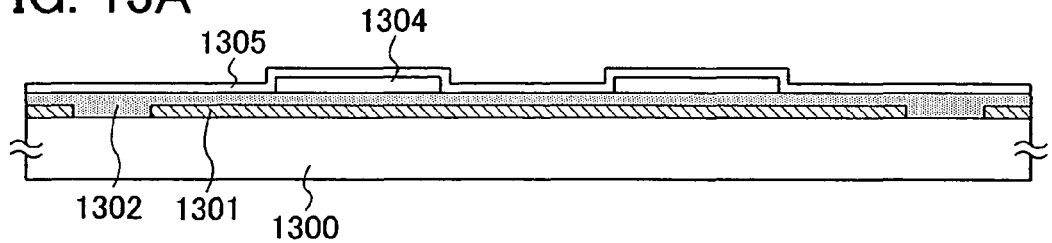
FIGS. 13A to 13E each show a manufacturing method of a semiconductor device according to the present invention.

As shown in FIG. 13A, an insulating substrate 1300 is prepared. A glass substrate, a quartz substrate, a plastic substrate, or the like can be used as the insulating substrate 1300. Further, these substrates can be formed thinner by polishing the back surface thereof or the like. Moreover, a substrate formed by providing a layer using an insulating material over a conductive substrate formed of a metal element or the like or a semiconductor substrate formed of silicon or the like can be used as well. By forming an IC chip over, for example, a plastic substrate, a highly flexible, lightweight, and thin device can be manufactured.

A peeling layer 1301 is selectively formed over the insulating substrate 1300. Needless to say, the peeling layer 1301 may be formed over the entire surface of the insulating substrate 1300. The peeling layer 1301 is formed of a single layer or stacked layers of a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si), an alloy material or a compound material containing the aforementioned element as a main component. A crystal structure of a layer containing silicon may be formed using any of amorphous, microcrystal, and polycrystalline structures.

A base layer 1302 is formed over the peeling layer 1301. The base layer 1302 can be formed of a single layer structure or stacked-layer structure of an insulating material such as silicon oxide, silicon nitride, or silicon oxynitride. In the case of using a stacked-layer structure, a silicon oxynitride layer is formed with a thickness of 10 to 200 nm (preferably 50 to 100 nm) as a first layer of the base layer 1302. The silicon oxynitride layer can be formed by using $SiH_4$, $NH_3$, $N_2O$, and $H_2$ as a reaction gas by a plasma CVD method. Subsequently, a silicon oxynitride layer is formed with a thickness of 50 to 200 nm (preferably 100 to 150 nm) as a second layer of the base layer 1302. The silicon oxynitride layer can be formed by using $SiH_4$ and $N_2O$ as a reaction gas by a plasma CVD method.

A semiconductor layer 1304 is formed over the base layer 1302. The semiconductor layer 1304 can be formed using a silicon semiconductor layer containing a material such as a silicon material, a material formed of silicon and germanium. A crystal structure of the semiconductor layer 1304 may be formed using any of amorphous, microcrystal, and polycrystalline structures.

In the case of forming the semiconductor layer using polycrystalline, heat treatment can be performed to an amorphous semiconductor layer. Laser irradiation, a heating furnace, lamp irradiation, or the like, or a combination thereof can be used for the heat treatment.

For laser irradiation, a continuous wave type laser beam (a CW laser) or a pulsed wave type laser beam (a pulsed laser) can be used. As the laser beam, a laser beam emitted from one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used. By irradiating the amorphous semiconductor layer with a fundamental wave of such a laser beam and any of a laser beam with a high harmonic, such as a second to fourth harmonic of the fundamental wave, a silicon layer having crystals with a large grain size can be obtained. As the harmonic, a second harmonic (532 nm) or a third harmonic (355 nm) of a Nd:$YVO_4$ laser (fundamental wave: 1064 nm) can be used. The laser requires a power density of approximately 0.01 to 100 MW/cm$^2$ (preferably, approximately 0.1 to 10 MW/cm$^2$). The laser is emitted at a scanning rate of approximately 10 to 2000 cm/sec.

A CW laser of a fundamental wave and a CW laser of a harmonic may be used for irradiation, or a CW laser of a fundamental wave and a pulsed laser of a harmonic may be used for irradiation. By using a plurality of laser light, a wide range of energy region can be treated.

It is also possible to use a pulsed laser beam with a repetition rate such that an amorphous silicon layer melted by a laser beam can be irradiated with the next pulsed laser beam before being solidified. By using a laser beam with such a repetition rate, a silicon layer with crystal grains that are grown continuously in the scan direction can be obtained. The repetition rate of such a laser beam is 10 MHz or higher, which is a much higher rate than that of the several tens to several hundreds of Hz of a conventionally used laser beam.

When an annealing furnace is used for heat treatment, an amorphous semiconductor layer is heated at a temperature of 400 to 550° C. for 2 to 20 hours. At this point, the temperature is preferably set in multiple stages in the range of 400 to 550° C. so as to increase gradually. Hydrogen and the like contained in the amorphous semiconductor layer are exhausted in the first low temperature heating step of about 400° C., which leads to a reduction in the roughness of the surface generated in crystallization.

In the aforementioned heat treatment, a metal for promoting the crystallization of the semiconductor layer, for example nickel (Ni), is added. For example, when the amorphous silicon layer is coated with a solution containing nickel and subjected to the heat treatment, the heating temperature can be reduced and a polycrystalline silicon layer with a continuous crystal grain boundary can be obtained. As a metal for promoting the crystallization, besides Ni, iron (Fe), ruthenium (Ru), rhodium (Rh), palladium (Pd), osmium (Os), iridium (Ir), platinum (Pt), copper (Cu), silver (Au), or the like can be employed.

Since the metal for promoting the crystallization becomes a source of pollution of a memory cell or the like, it is desirable that a gettering step for removing the metal be performed after the semiconductor layer is crystallized. In the gettering step, after the semiconductor layer is crystallized, a layer functioning as a gettering sink is formed over the semiconductor layer and heated, so that the metal moves to the gettering sink. As the gettering sink, a polycrystalline semiconductor layer or a semiconductor layer doped with an impurity can be used. For example, a polycrystalline semiconductor layer doped with an inert element such as argon may be formed over the polycrystalline silicon layer and used as the gettering sink. When the gettering sink is doped with an inert element, distortion occurs and the metal can be captured more efficiently. Alternatively, the metal may be captured by doping a part of a semiconductor layer of a TFT with an element such as phosphorus, without forming a gettering sink.

The semiconductor layer formed thus is processed into a predetermined shape to form an island-shaped semiconductor layer 1304. As a processing means, etching is conducted using a mask that is formed by photolithography. Wet etching or dry etching can be used for the etching.

An insulating layer functioning as a gate insulating layer 1305 is formed so as to cover the semiconductor layer 1304. The gate insulating layer 1305 can be formed using similar materials and methods to the base layer 1302.

Figure 13B:
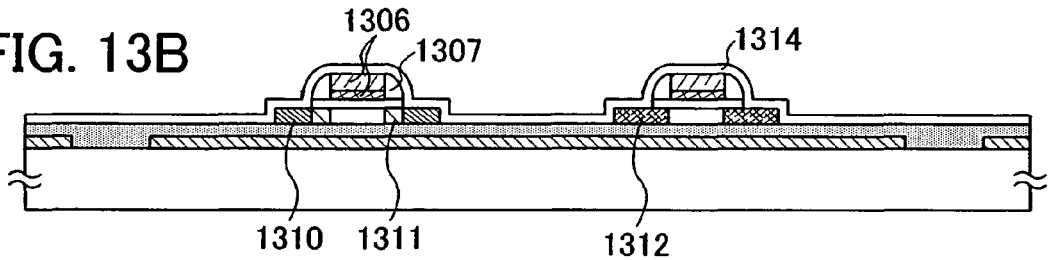

As shown in FIG. 13B, a conductive layer functioning as a gate electrode layer 1306 is formed over the gate insulating layer 1305. The gate electrode layer 1306 can be formed using a film formed of aluminum (Al), titanium (Ti), molybdenum (Mo), tantalum (Ta), tungsten (W), or silicon (Si), or using an alloy film containing these elements. The gate electrode layer 1306 can have a single layer structure or stacked-layer structure. As the stacked-layer structure, tantalum nitride and tungsten may be stacked. The gate electrode layer 1306 is processed by etching using a mask which is formed by photolithography. Wet etching or dry etching can be used for the etching.

An insulator called a sidewall 1307 is formed on a side surface of the gate electrode layer 1306. The sidewall 1307 can be formed using similar materials and methods to the base layer 1302. An edge portion of the sidewall 1307 may be tapered by isotropic etching. The sidewall 1307 can prevent a short channel effect generated as a gate length becomes narrow. The short channel effect is pronounced in n-channel TFTs, so the sidewall 1307 is preferably provided on a side surface of a gate electrode of an n-channel TFT.

Then, the gate insulating layer 1305 is etched. As a result, a portion of the semiconductor layer 1304 and the base layer 1302 are exposed. Wet etching or dry etching can be used for the etching.

Using the gate electrode layer 1306 and the sidewall 1307, the semiconductor layer 1304 is doped with an impurity element to form high concentration impurity regions 1310 and 1312. In the case of forming an n-channel TFT, phosphorus (P) can be used as the impurity element, while boron (B) can be used in the case of forming a p-channel TFT. At this point, in accordance with the amount of impurity element, a low concentration impurity region is formed under the sidewall 1307. In this embodiment mode, a low concentration impurity region 1311 is formed in only an impurity region of an n-channel TFT, because the low concentration impurity region 1311 can prevent a short channel effect from occurring. A structure having such a low concentration impurity region is referred to as an LDD (Lightly Doped Drain) structure.

Subsequently, an insulating layer 1314 is formed so as to cover the base layer 1302, the semiconductor layer 1304, the gate electrode layer 1306, and the sidewall 1307. The insulating layer 1314 may be formed of a material containing silicon by a CVD method.

After forming the insulating layer 1314, heat treatment is performed if required. The heat treatment can be carried out using similar means to that of the aforementioned crystallization. By this heat treatment, the impurity regions can be activated. The insulating layer 1314 formed by a CVD method contains a lot of hydrogen, so a reduction in the roughness of a film in the impurity regions can be obtained, since the heat treatment disperses the hydrogen.

Figure 13C:
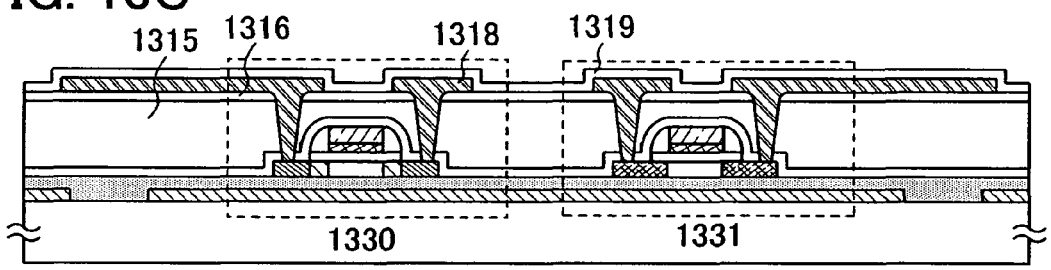

As shown in FIG. 13C, insulating layers 1315 and 1316 which function as interlayer insulating films are formed. An inorganic material or an organic material can be used for the insulating layers 1315 and 1316. As the inorganic material, silicon oxide, silicon nitride, silicon oxynitride, or the like can be used. As the organic material, polyimide, acrylic, polyamide, polyimide amide, resist, benzocyclobutene, siloxane, or polysilazane can be used. Note that siloxane has a skeleton structure formed of a bond of silicon (Si) and oxygen (O). As a substituent, an organic group containing at least hydrogen (for example, an alkyl group or an aromatic hydrocarbon) is used. A fluoro group may also be used as the substituent. In addition, an organic group containing at least hydrogen, and a fluoro group may be used as the substituent. Polysilazane is formed of a polymer material including a bond of silicon (Si) and nitrogen (N) as a starting material. If an inorganic material is used, penetration of an impurity element can be prevented, while planarity can be enhanced if an organic material is used. Therefore, in this embodiment mode, an inorganic material is used for the insulating layer 1315 and an organic material is used for the insulating layer 1316.

A contact hole is formed in the insulating layers 1314, 1315, and 1316, thereby forming a wire 1318. The wire 1318 can be formed of a film formed of an element selected from among aluminum (Al), titanium (Ti), molybdenum (Mo), tantalum (Ta), tungsten (W), or silicon (Si), or from an alloy film containing these elements. The wire 1318 can be formed of a single layer structure or stacked-layer structure. For example, tungsten, tungsten nitride, or the like as a first layer, an alloy of aluminum and silicon (Al—Si) or an alloy of aluminum and titanium (Al—Ti) as a second layer, and a titanium nitride film, a titanium film, or the like as a third layer may be stacked sequentially. The wire 1318 may be processed by etching using a mask which is formed by photolithography. Wet etching or dry etching can be used for the etching. The wire 1318 is connected to the impurity regions in the semiconductor layer 1304, and such a wire can be called a source electrode or a drain electrode.

Thus, an n-channel TFT 1330 and a p-channel TFT 1331 can be formed.

Subsequently, a protective film 1319 is formed over the wire 1318 if required. The protective film 1319 can be formed of an oxide containing silicon or of a nitride containing silicon. For example, the protective film 1319 may be formed of silicon nitride, and thereby, the penetration of moisture and oxygen can be prevented.

Figure 13D:
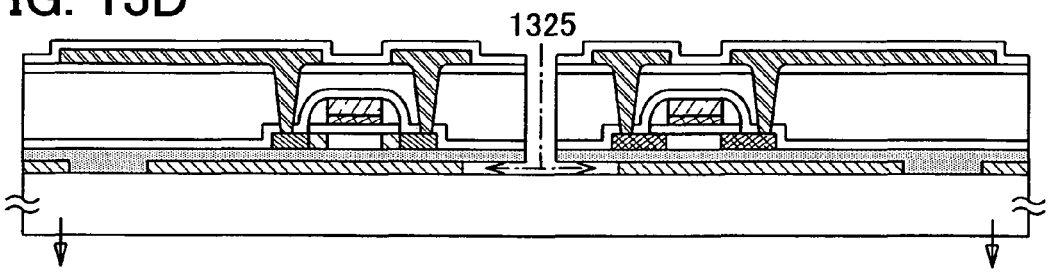

As shown in FIG. 13D, an opening is formed between TFTs, and etchant 1325 is introduced. The opening can be formed by wet etching or dry etching. Note that the position where the opening is formed does not have to be between TFTs, and may be a region where the semiconductor layer 1304 is not formed. For the etchant 1325, for wet etching, a mixed solution in which hydrofluoric acid is diluted with water or ammonium fluoride, a mixed solution of hydrofluoric acid and nitric acid, a mixed solution of hydrofluoric acid, nitric acid, and acetic acid, a mixed solution of hydrogen peroxide and sulfuric acid, a mixed solution of hydrogen peroxide, an ammonium solution, and water, a mixed solution of hydrogen peroxide, hydrochloric acid, and water, or the like can be used. For dry etching, a gas containing halogen-based atoms or molecules, such as fluorine or a gas containing oxygen is used. It is preferable to use a gas or a solution containing halogen fluoride or an interhalogen compound, for example, chlorine trifluoride ($ClF_3$), as the etchant.

The peeling layer 1301 is removed by the introduction of the etchant. Then, the insulating substrate 1300 is peeled off. In this manner, a thin and lightweight IC chip can be manufactured.

Besides using the method of introducing etchant, the insulating substrate 1300 may be physically peeled off by a method such as exposing the peeling layer 1301 by laser drawing, or cutting a side of the IC chip.

Figure 13E:
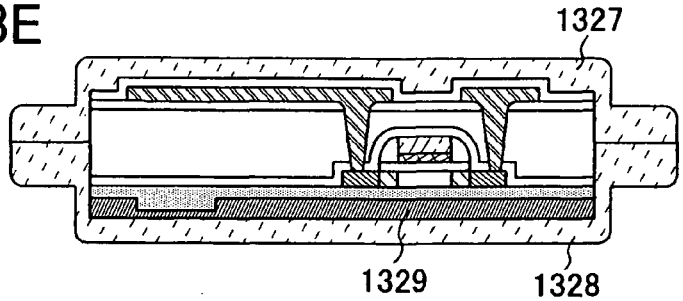

As shown in FIG. 13E, an IC chip can be completed by being covered with films 1327 and 1328. At this point, the films 1327 and 1328 may be attached by using an adhesive layer 1329. A protective film may be formed over the films 1327 and 1328 to prevent the penetration of moisture, oxygen, or the like. Since the protective film 1319 is formed over the wire 1318, a protective film may also be formed under the base layer 1302 or the adhesive layer 1329. The protective film can be formed of oxide containing silicon or nitride containing silicon.

The IC chip formed over the insulating substrate and peeled off the insulating substrate can be provided at low cost and can be lightweight. Further, as such an IC chip is highly flexible, it can be attached to a curved surface.

This embodiment mode can be implemented by being freely combined with any parts of other embodiment modes in this specification. Therefore, with the IC chip including the anti-collision function of a semiconductor device according to the present invention, it is not necessary to remake an IC chip from the stage of mask design due to a change in specifications of a product accompanying a change of the kind or standard of a signal of a wireless means for each product. Accordingly, a change in specification accompanying a change of the kind or standard of a signal of a wireless means for each product can be dealt with a mere change of the anti-collision program, and production cost and production time can be reduced. In addition, there is no concern that an IC chip remade due to a change in mask design will malfunction.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

Embodiment Mode 4

Figure 14A:
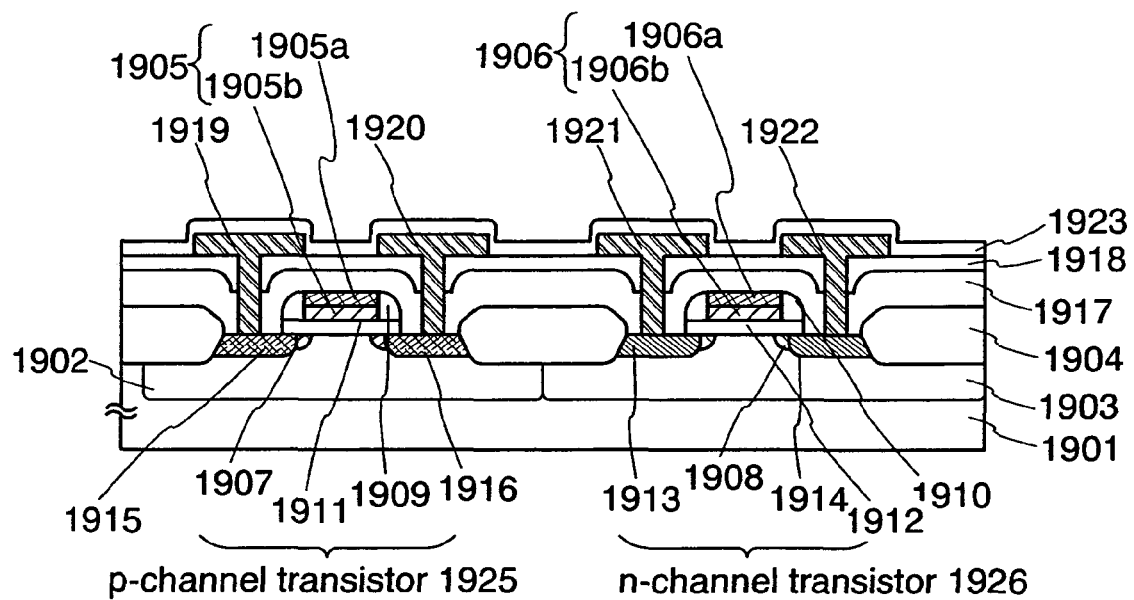
FIGS. 14A and 14B each show a manufacturing method of a semiconductor device according to the present invention

In this embodiment mode, a mode in which an IC chip is formed using a transistor formed over single-crystal silicon is described with reference to FIGS. 14A and 14B.

First, a manufacturing process of a transistor is described with reference to FIG. 14A. A silicon substrate 1901 formed of single-crystal silicon is prepared. Then, an n well 1902 is selectively formed in a first element formation region over a main surface (an element formation surface or a circuit formation surface) of the silicon substrate, and a p well 1903 is selectively formed in a second element formation region over the same surface. Further, the silicon substrate can be made thinner by polishing the back surface thereof or using another such method. By forming a silicon substrate thinner in advance, a lightweight and thin semiconductor device can be manufactured.

Next, a field oxide film 1904 to be an element isolation region for partitioning the first element formation region and the second element formation region is formed. The field oxide film 1904 is a thick thermal oxide film and may be formed by a known LOCOS method. Note that the method for partitioning the element formation regions is not limited to a LOCOS method. For example, by using a trench isolation method, the element isolation region may be formed to have a trench structure, or a LOCOS structure and a trench structure may be combined.

Next, a gate insulating film is formed by, for example, thermally oxidizing the surface of the. silicon substrate. The gate insulating film may also be formed by a CVD method. A silicon oxynitride film, a silicon oxide film, a silicon nitride film, or a stack thereof may be used.

Next, a stack film of polysilicon layers 1905b and 1906b and silicide layers 1905a and 1906a is formed over the entire surface. By forming the stack film by lithography and dry etching, gate electrodes 1905 and 1906 having a polycide structure are formed over the gate insulating film. The polysilicon layers 1905b and 1906b may be doped with phosphorus (P) at a concentration of about $10^{21}/cm^3$ in order to reduce resistance. Alternatively, high concentration n-type impurities may be diffused after forming the polysilicon layer. Further, the silicide layers 1905a and 1906a can be formed of a material such as molybdenum silicide (MoSix), tungsten silicide (WSix), tantalum siliside (TiSix), or titanium silicide (TiSix), using a known method.

Next, the silicon semiconductor substrate is subjected to ion implantation through the gate insulating film to form an extension region. In this embodiment mode, an impurity region formed between each channel forming region and each source and drain region is referred to as an extension region. The impurity concentration in extension regions 1907 and 1908 may be lower, higher, or the same as the impurity concentration in the source region and the drain region. That is, the impurity concentration of the extension region may be determined depending on the characteristics required for a semiconductor device.

Since this embodiment mode describes a case where a CMOS circuit applied to the present invention is manufactured, the first element formation region for forming a p-channel FET is coated with a resist material, and arsenic (As), which is an n-type impurity, or phosphorus (P), which is an n-type impurity, is implanted into the silicon substrate. Further, the second element formation region for forming an n-channel FET is coated with a resist material, and boron (B), which is a p-type impurity, is implanted into the silicon substrate.

Next, a first activation treatment is conducted in order to activate the ion implanted impurities and to repair crystal defects in the silicon substrate generated by ion-implantation. In the activation treatment, the semiconductor substrate is heated up to a temperature around the melting point of Si.

Next, sidewalls 1909 and 1910 are formed on the sides of the gate electrodes. For example, an insulating material layer formed of silicon oxide may be deposited over the entire surface by a CVD method, and the insulating material layer may be etched back to form the sidewalls. In the etch back, the gate insulating film may be selectively removed in a self-aligning manner. Alternatively, the gate insulating film may be etched after the etch back. Thus, gate insulating films 1911 and 1912, having a width which is the sum of the width of the gate electrode and the width of the sidewalls provided on either side of the gate electrode, are formed.

Next, the exposed silicon substrate is subjected to ion implantation, to form a source region and a drain region. The first element formation region for forming a p-channel FET is coated with a resist material, and arsenic (As), which is an n-type impurity, or phosphorus (P), which is an n-type impurity, is implanted into the silicon substrate to form a source region 1913 and a drain region 1914. Further, the second element formation region for forming an n-channel FET is coated with a resist material, and boron (B), which is a p-type impurity, is implanted into the silicon substrate to form a source region 1915 and a drain region 1916.

Subsequently a second activation treatment is conducted in order to activate the ion implanted impurities and to repair crystal defects in the silicon substrate generated by ion-implantation.

After the activation, an interlayer insulating film, a plug electrode, a metal wire, and the like are formed. A first interlayer insulating film 1917 is formed with a silicon oxide film, a silicon oxynitride film, or the like by a plasma CVD method or a low pressure CVD method. Further, a second interlayer insulating film 1918 formed of phosphosilicate glass (PSG), borosilicate glass (BSG), or borophosphosilicate glass (BPSG) is formed thereover. The second interlayer insulating film 1918 is manufactured by a spin coating method or a normal pressure CVD method to increase planarity. Note that the interlayer insulating film may be a single layer structure or a multilayer structure of three or more layers.

Source electrodes 1919 and 1921 and drain electrodes 1920 and 1922 are formed after forming contact holes reaching the source regions and the drain regions of the respective FETs in the first interlayer insulating film 1917 and the second interlayer insulating film 1918. Aluminum (Al), which is commonly used as a low resistance material, may be used for the formation. Further, the electrodes may have a stacked structure of Al and titanium (Ti).

Note that the contact holes may be formed by an electron beam direct writing technique. Resist for positive electron beam lithography is formed on the entire surface of the first interlayer insulating film 1917 and the second interlayer insulating film 1918 by electron beam direct writing, and a portion irradiated with an electron beam is dissolved using a developing solution. Then, holes are opened in the resist of a position where the contact holes are to be formed, and dry etching is performed using the resist as a mask, so that predetermined positions of the first interlayer insulating film 1917 and the second interlayer insulating film 1918 can be etched to form the contact holes.

Lastly, a passivation film 1923 is formed. In FIG. 14A, a transistor shown on the left side is a p-channel transistor 1925 and a transistor shown on the right side is an n-channel transistor 1926.

Further, the passivation film 1923 is formed of a silicon nitride film, a silicon oxide film, or a silicon nitride oxide film by a plasma CVD method. In addition, an organic resin film may be stacked instead of the silicon nitride film or the like, or an organic resin film may be stacked over the passivation film. As the organic resin material, polyimide, polyamide, acrylic, benzocyclobutene (BCB), or the like can be used. It is advantageous to use an organic resin film because, for example, the method for forming the film is simple, parasitic capacitance can be reduced because of the low dielectric constant, it is suitable for planarization. Naturally, an organic resin film other than the one mentioned above may also be used.

In this manner, the p-channel transistor 1925 and the n-channel transistor 1926 can be formed over a single crystalline substrate.

Note that the semiconductor device may be made even thinner by polishing the back surface of the substrate over which the p-channel transistor 1925 and the n-channel transistor 1926 are formed, for example. By making the silicon substrate thinner, a lightweight and thin semiconductor device can be manufactured.

Figure 14B:
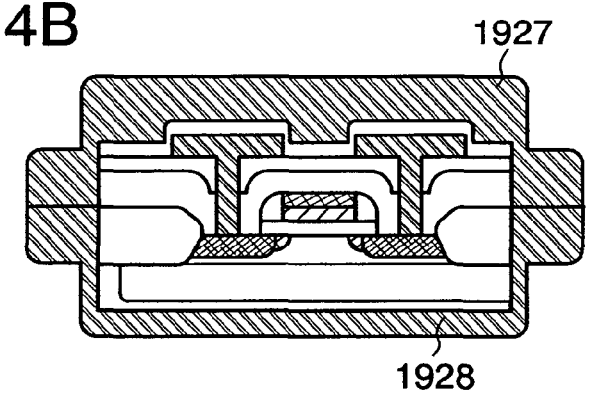

As shown in FIG. 14B, an IC chip can be completed by being covered with films 1927 and 1928. A protective film may be formed over the films 1927 and 1928 to prevent penetration of moisture, oxygen, or the like. The protective film can be formed of oxide containing silicon or nitride containing silicon. In addition, a pattern which is to be an antenna of the IC chip may be formed on the film.

A product which is miniaturized and lightweight can be provided by forming an IC chip over a single crystalline substrate in this manner. Further, a miniaturized semiconductor device can be made by using such an IC chip, and there are few variations in transistors, which is ideal.

This embodiment mode can be implemented by being freely combined with any parts of other embodiment modes in this specification. Therefore, with the IC chip including the anti-collision function of a semiconductor device according to the present invention, it is not necessary to remake an IC chip from the stage of mask design due to a change in specifications of a product accompanying a change of the kind or standard of a signal of a wireless means for each product. Accordingly, a change in specification accompanying a change of the kind or standard of a signal of a wireless means for each product can be dealt with a mere change of the anti-collision program, and production cost and production time can be reduced. In addition, there is no concern that an IC chip remade due to a change in mask design will malfunction.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

Embodiment Mode 5

Figure 15:
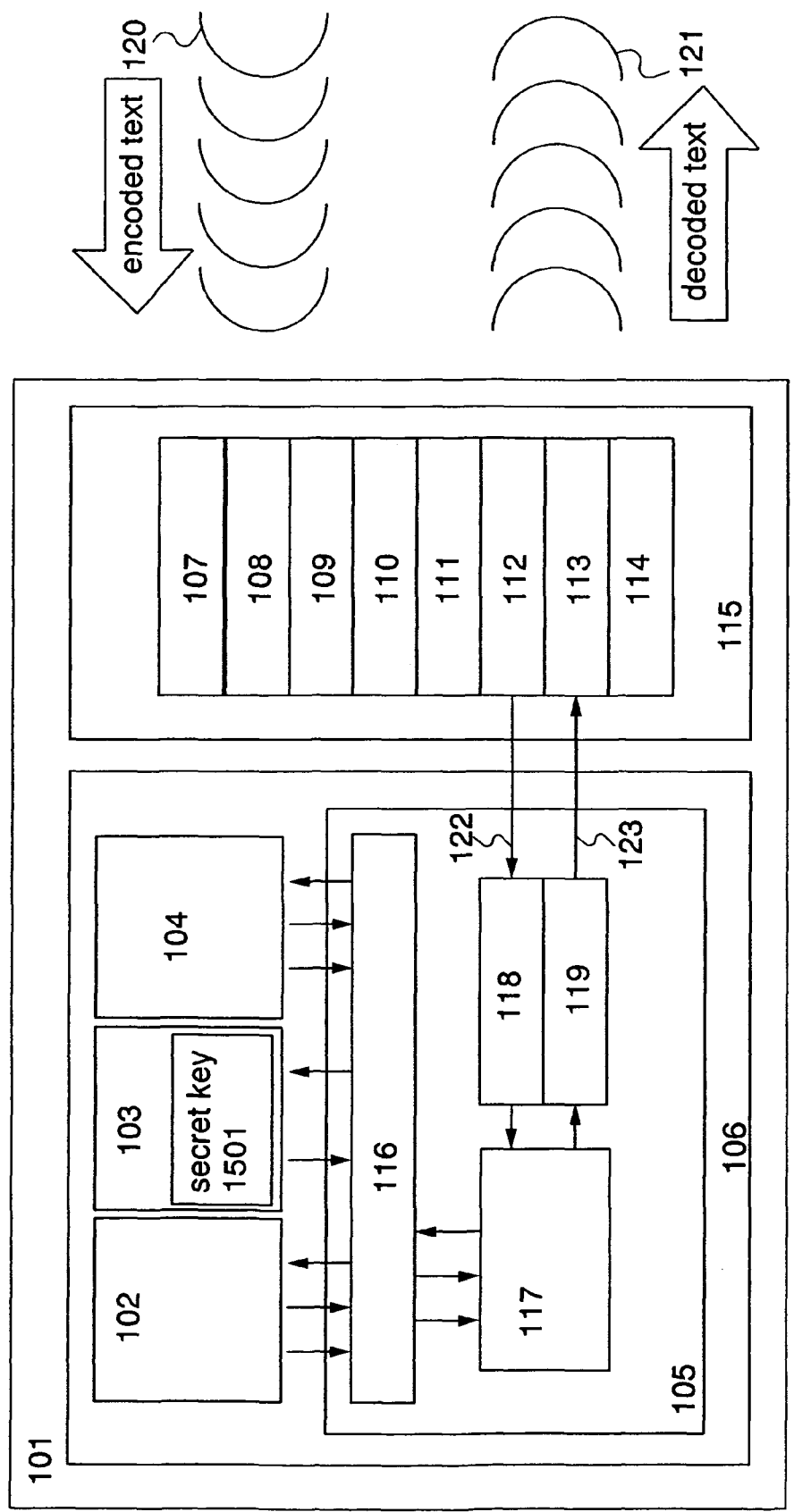
FIG. 15 is a block diagram showing a semiconductor device according to the present invention.

This embodiment mode describes an IC chip having an encryption function as an example of a semiconductor device according to the present invention, with reference to FIG. 15.

First, a block configuration of an IC chip is described with reference to FIG. 15. In FIG. 15, the IC chip 101 includes the arithmetic circuit 106, which includes the CPU 102, the ROM 103, the RAM 104, and the controller 105, and the analog portion 115, which includes the antenna 107, the resonant circuit 108, the power supply circuit 109, the reset circuit 110, the clock generating circuit 111, the demodulation circuit 112, the modulation circuit 113, and the power source managing circuit 114. The controller 105 is formed by the CPU interface (CPUIF) 116, the control register 117, the code extracting circuit 118, and the encoding circuit 119. Note that in FIG. 15, communication signals are shown separately as a reception signal 120 and a transmission signal 121 for simplicity of explanation; however, they are actually combined, and transmitted and received between the IC chip 101 and a reader/writer at the same time. The reception signal 120 is demodulated by the demodulation circuit 112 after being received by the antenna 107 and the resonant circuit 108. The transmission signal 121 is transmitted from the antenna 107 after being modulated by the modulation circuit 113.

In FIG. 15, when the IC chip 101 is placed in a magnetic field formed by a communication signal, an induced electromotive force is generated by the antenna 107 and the resonant circuit 108. The induced electromotive force is held by electric capacitance of the power supply circuit 109, its potential is stabilized by the electric capacitance, and it is supplied as a power source voltage to each circuit in the IC chip 101. The reset circuit 110 generates an initial reset signal of the whole IC chip 101. For example, a signal which starts with a delay to a rise in the power source voltage is generated as a reset signal. The clock generating circuit 111 changes a frequency and a duty ratio of a clock signal in accordance with a control signal generated by the power source managing circuit 114. The demodulation circuit 112 detects a change in amplitude of the reception signal 120 of an ASK method as received data "0"/"1" 122. As the demodulation circuit 112, a low pass filter is used, for example. The demodulation circuit 113 transmits transmission data by changing the amplitude of the transmission signal 121 of an ASK method. For example, when transmission data 123 is "0", a resonance point of the resonant circuit 108 is changed so as to change the amplitude of the communication signal. The power source managing circuit 114 manages a power source voltage supplied from the power supply circuit 109 to the arithmetic circuit 106 and the current consumption at the arithmetic circuit 106, and generates a control signal for changing the frequency and the duty ratio of the clock signal at the clock generating circuit 111.

An operation of an IC chip of this embodiment mode is described. First, the reception signal 120 containing encoded text data and transmitted from the reader/writer is received by the IC chip 101. The reception signal 120 is demodulated by the demodulation circuit 112, divided into a control command, the encoded text data, and the like by the code extracting circuit 118, and stored in the control register 117. Here, the control command is data to specify a response of the IC chip 101. For example, transmission of a specific ID number, operation stop, encryption, or the like is specified. Herein, a control command for encryption is received.

Next, in the arithmetic circuit 106, the CPU 102 decrypts (decodes) the encoded text by using a secret key 1501 stored in the ROM 103 in advance in accordance with a decryption program stored in the ROM 103. The encoded text (decoded text) is stored in the control register 117. At this time, the RAM 104 is used as a data storing region. Note that the CPU 102 accesses the ROM 103, the RAM 104, and the control register 117 through the CPUIF 116. The CPUIF 116 has a function of generating an access signal for any of the ROM 103, the RAM 104, and the control register 117 from an address requested by the CPU 102.

Lastly, the transmission data 123 is generated from the decoded text in the encoding circuit 119 and modulated in the modulation circuit 113; thereby the transmission signal 121 is transmitted from the antenna 107 to the reader/writer.

Note that in this embodiment mode, as an arithmetic method, a method is employed in which processing is done by software, that is, a method is employed in which an arithmetic circuit is constituted by a CPU and a large capacity memory, and a program is executed by the CPU; however, the most suitable arithmetic method can be selected for the application and the arithmetic circuit can be formed based on the selected method. For example, as the arithmetic method, a method in which processing is done by hardware or a method using both hardware and software can be used. In a method where processing is done by hardware, a dedicated circuit may be used to constitute the arithmetic circuit. In the method where both hardware and software are used, a dedicated circuit, a CPU, and a memory may be used to constitute the arithmetic circuit, wherein the dedicated circuit performs a part of an arithmetic process and the CPU executes a program of the rest of the arithmetic process.

This embodiment mode can be implemented by being freely combined with any parts of other embodiment modes in this specification. Therefore, with the IC chip including the anti-collision function of a semiconductor device according to the present invention, it is not necessary to remake an IC chip from the stage of mask design due to a change in specifications of a product accompanying a change of the kind or standard of a signal of a wireless means for each product. Accordingly, a change in specification accompanying a change of the kind or standard of a signal of a wireless means for each product can be dealt with a mere change of the anti-collision program, and production cost and production time can be reduced. In addition, there is no concern that an IC chip remade due to a change in mask design will malfunction.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

Embodiment Mode 6

An antenna may have a size and a shape suitable for the application in a range determined by the Radio Law. A signal to be transmitted and received has a frequency of 125 kHz, 13.56 MHz, 915 MHz, 2.45 GHz, or the like, which is set by the ISO standard or the like. Specifically, a dipole antenna, a patch antenna, a loop antenna, a Yagi antenna, or the like may be used as the antenna. In this embodiment mode, a shape of an antenna connected to the IC chip is described.

Figure 16A:
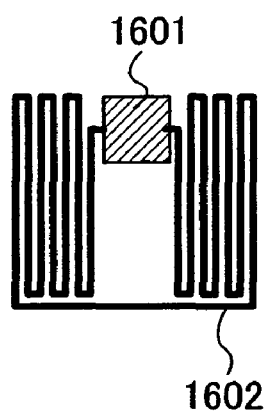
FIGS. 16A to 16D each show an antenna shape of the present invention.

FIG. 16A shows an antenna 1602 connected to an IC chip 1601. In FIG. 16A, the IC chip 1601 is provided in a center portion and the antenna 1602 is connected to a connecting terminal of the IC chip 1601. In order to ensure the antenna is long enough, the antenna 1602 is folded in a rectangular shape.

Figure 16B:
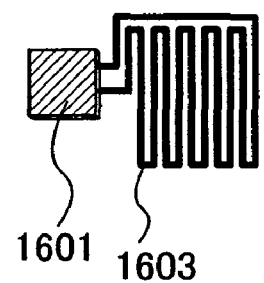

In FIG. 16B, the IC chip 1601 is provided on one end side and an antenna 1603 is connected to a connecting terminal of the IC chip 1601. In order to ensure the antenna is long enough, the antenna 1603 is folded in a rectangular shape.

Figure 16C:
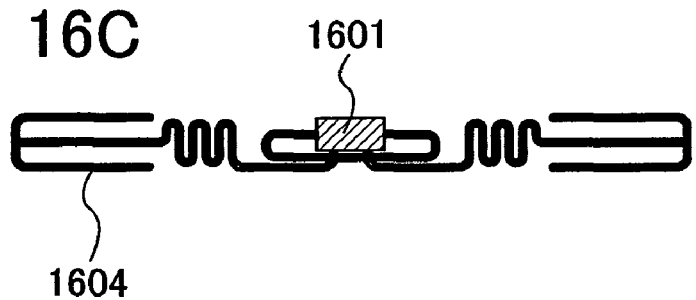

In FIG. 16C, an antenna 1604 which is folded in a rectangular shape is provided at both ends of the IC chip 1601.

Figure 16D:
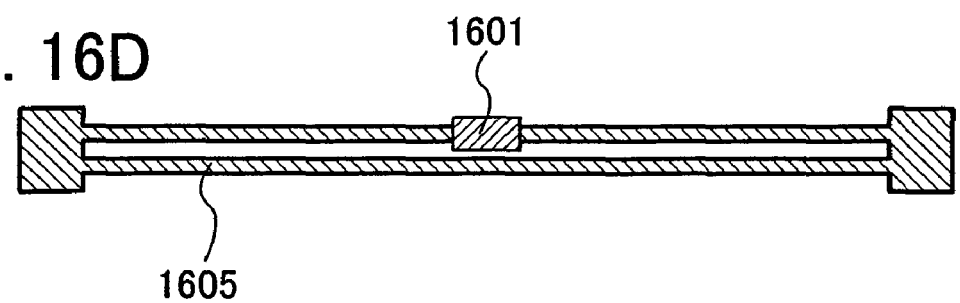

In FIG. 16D, a linear antenna 1605 is provided at both ends of the IC chip 1601.

In this manner, a shape of an antenna may be selected to be suitable for a structure, a polarized wave, or an application of an IC chip. Therefore, a folded dipole antenna may be used for the dipole antenna. A circular loop antenna or a square loop antenna may be used as the loop antenna. A circular patch antenna or a square patch antenna may be used as the patch antenna.

In the case of using a patch antenna, an antenna formed of a dielectric material such as ceramic may be used. By setting a dielectric constant of a dielectric material to be used as a substrate for the patch antenna high, the antenna can be miniaturized. Moreover, as a patch antenna has high mechanical strength, it can be used repeatedly.

A dielectric material of a patch antenna can be formed of ceramic, an organic resin, a mixture of ceramic and an organic resin, or the like. A typical example of ceramic is alumina, glass, forsterite, or the like. Moreover, a plurality of ceramics may be mixed and used. In order to obtain a high dielectric constant, it is preferable to form a dielectric layer using a ferroelectric material. A typical example of a ferroelectric material is barium titanate ($BaTiO_3$), lead titanate ($PbTiO_3$), strontium titanate ($SrTiO_3$), lead zirconate ($PbZrO_3$), lithium niobate ($LiNbO_3$), lead zirconate titanate (PZT), or the like. Furthermore, a plurality of ferroelectric materials may be mixed and used.

This embodiment mode can be implemented by being freely combined with any parts of other embodiment modes in this specification. Therefore, with the IC chip including the anti-collision function of a semiconductor device according to the present invention, it is not necessary to remake an IC chip from the stage of mask design due to a change in specifications of a product accompanying a change of the kind or standard of a signal of a wireless means for each product. Accordingly, a change in specification accompanying a change of the kind or standard of a signal of a wireless means for each product can be dealt with a mere change of the anti-collision program, and production cost and production time can be reduced. In addition, there is no concern that an IC chip remade due to a change in mask design will malfunction.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

Embodiment Mode 7

A semiconductor device according to the present invention can be used as an IC chip. For example, it can be provided and used as an IC chip in paper money, coins, valuable securities, certificates, bearer bonds, packing containers, books, recording media, personal items, vehicles, food items, clothes, healthcare items, lifestyle goods, medicals, electronic apparatuses, or the like. Specific examples thereof are described with reference to FIG. 17. The IC chip of the present invention has a collision avoidance function for transmission/reception of a signal between a reader/writer and an IC chip. Therefore, information in an IC chip attached to various articles such as those shown in FIG. 17 can be read at the same time. In addition, an RFID can be made thinner by using a thin film transistor as shown in Embodiment Mode 3; therefore, deterioration in the design characteristics of an article can be prevented.

Figure 17:
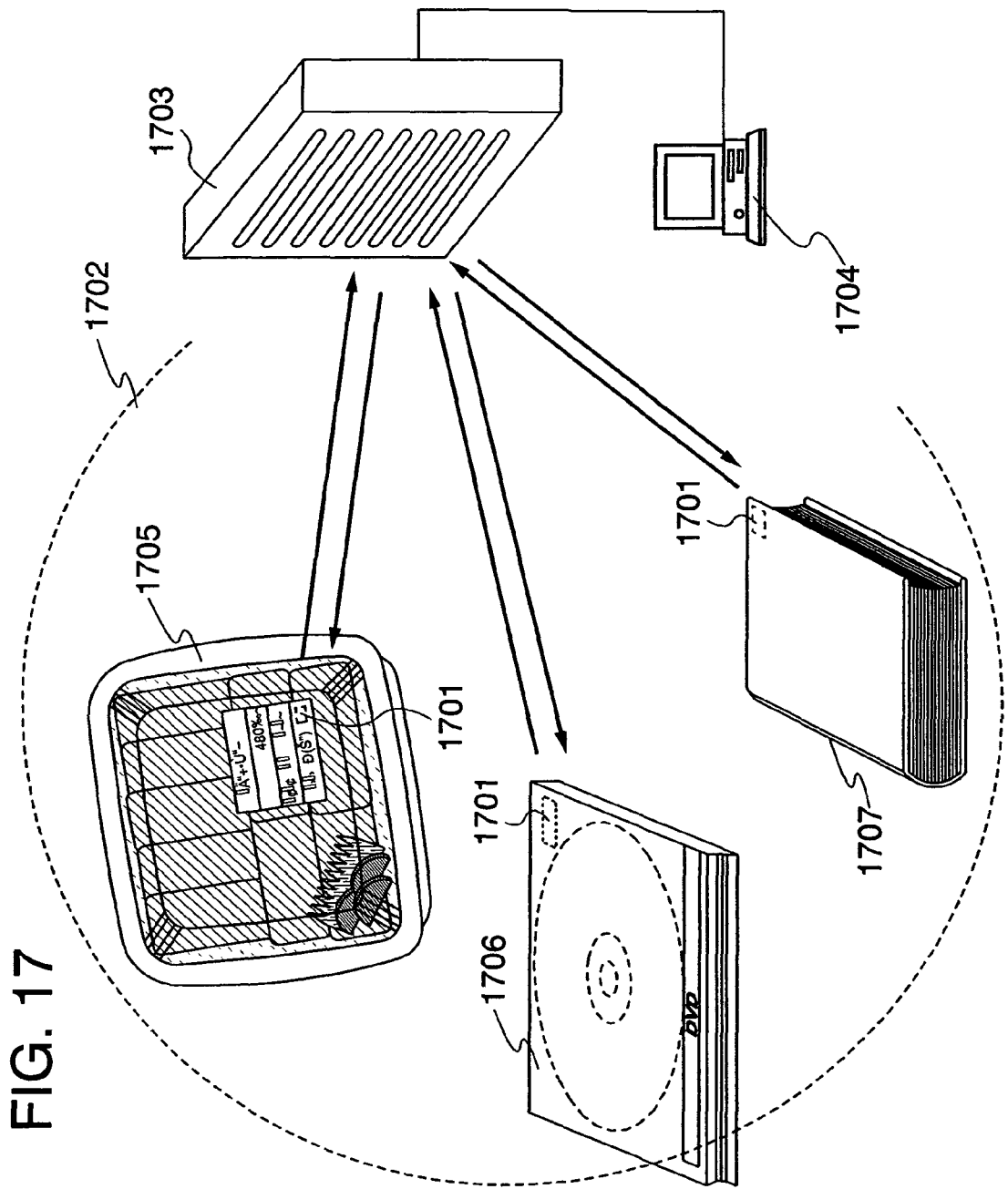
FIG. 17 is a diagram showing examples of using a semiconductor device according to the present invention.

FIG. 17 shows one embodiment of reading of the present invention. An IC chip 1701 shown in FIG. 17 is a noncontact type IC chip which transmits/receives data with a reader/writer 1703 by non-contact. The IC chip 1701 which is in an area of an electric wave 1702 can communicate with the reader/writer 1703 wirelessly. Note that a distance between the IC chip 1701 and the reader/writer 1703, namely the distance of the area of the electric wave 1702, depends on a frequency which is used for the wireless communication. In addition, the frequency depends on the effective antenna length used for the IC chip 1701. The effective antenna length depends on the antenna shape.

In FIG. 17, a packaging container 1705, a storage medium 1706, and a book 1707 lie within range of the electric wave of the reader/writer 1703, and the reader/writer 1703 is electrically connected to a computer and performs management of an article, reading of information of an article, or the like. The packing container 1705 means a wrapping paper for a lunch box or the like, a plastic bottle, or the like. The book 1707 means a book, a volume, or the like. The recording medium 1706 means DVD software, a video tape, or the like. In FIG. 17, the reader/writer 1703 instantly reads each piece of information in the packaging container 1705, the storage medium 1706, and the book 1707, which each have the IC chip 1701 including a collision avoidance function of the present invention and which are in the area of the electric wave 1702.

By providing the IC chip 1701 for the packaging container 1705, the storage medium 1706, the book 1707, and the like, the efficiency of the inspection system, the rental system and the like can be improved. The IC chip 1701 may be attached to a surface of an object or embedded in an object. For example, the IC chip may be embedded in paper of a book, or embedded in an organic resin of a package. In this manner, by providing an IC chip for the packaging container 1705, the storage medium 1706, the book 1707, and the like, efficiency of the inspection system, the rental system and the like can be improved.

As described hereinabove, a semiconductor device according to the present invention may be provided and used in any object, and can be used in paper money, coins, valuable securities, certificates, bearer bonds, personal items, vehicles, food items, clothes, healthcare items, lifestyle goods, medicals, electronic apparatuses, or the like. Note that this embodiment mode can be implemented by being freely combined with the above-described embodiment modes.

This embodiment mode can be implemented by being freely combined with any parts of other embodiment modes in this specification. Therefore, with the IC chip including the anti-collision function of a semiconductor device according to the present invention, it is not necessary to remake an IC chip from the stage of mask design due to a change in specifications of a product accompanying a change of the kind or standard of a signal of a wireless means for each product. Accordingly, a change in specification accompanying a change of the kind or standard of a signal of a wireless means for each product can be dealt with a mere change of the anti-collision program, and production cost and production time can be reduced. In addition, there is no concern that an IC chip remade due to a change in mask design will malfunction.

In addition, when a conventional IC chip having an exclusive collision avoidance function is manufactured, the IC chip is equipped with a circuit provided with a collision avoidance function. However, according to the present invention, a read only memory stores a collision avoidance function as a program, so malfunctions of an IC chip can be reduced, since the read only memory is easy to make compared with a circuit provided with a collision avoidance function.

This application is based on Japanese Patent Application serial No. 2005-349970 field in Japan Patent Office on Dec. 2, 2005, the entire contents of which are hereby incorporated by reference.

What is claimed is:

1. A semiconductor device comprising:
   a circuit for wirelessly transmitting a plurality of first signals to outside of the semiconductor device or for wirelessly receiving a plurality of second signals from outside of the semiconductor device;
   a central processing unit interface;
   a RAM directly connected to the central processing unit interface and configured to store processing data;
   a ROM directly connected to the central processing unit interface and configured to store a program to avoid a collision of the plurality of first signals or the plurality of second signals;
   a control register directly connected to the central processing unit interface;
   a code extracting circuit connected between the circuit and the control register;
   an encoding circuit connected between the circuit and the control register; and
   a central processing unit directly connected to the central processing unit interface and configured to execute the program.

2. The semiconductor device according to claim 1, wherein the wireless transmission uses radio frequency signals.

3. The semiconductor device according to claim 1, wherein the program comprises a plurality of routines.

4. The semiconductor device according to claim 1, further comprising an auxiliary arithmetic circuit to execute the program.

5. The semiconductor device according to claim 1, wherein each of the plurality of first signals comprises a start code of a frame, a flag code, a command code, a data code, a cyclic redundancy check code, and an end code of a frame.

6. The semiconductor device according to claim 1, wherein the circuit comprises at least one of an antenna, a resonant circuit, a power supply circuit, a reset circuit, a clock generating circuit, a demodulation circuit, a modulation circuit, and a power source managing circuit.

7. The semiconductor device according to claim 1, wherein the semiconductor device is at least one of an ID chip, an IC tag, an ID tag, an RF tag, a wireless tag, an electronic tag, and a transponder.

8. The semiconductor device according to claim 1, further comprising a random access memory,
wherein the random access memory is configured to store data; and
wherein the memory is a read-only memory configured to store the program.

9. A semiconductor device comprising:
a circuit for wirelessly transmitting a plurality of first signals to outside of the semiconductor device or for receiving a plurality of second signals from outside of the semiconductor device;
a central processing unit interface;
a RAM directly connected to the central processing unit interface and configured to store processing data;
a ROM directly connected to the central processing unit interface and configured to store a program to avoid a collision of the plurality of first signals or the plurality of second signals;
a control register directly connected to the central processing unit interface;
a code extracting circuit connected between the circuit and the control register;
an encoding circuit connected between the circuit and the control register;
a central processing unit directly connected to the central processing unit interface and configured to execute the program; and
a controller including the central processing unit interface, the control register, the code extracting circuit and the encoding circuit, and configured to provide the central processing unit with a mask length code,
wherein the program comprises a first routine to determine a flag of the plurality of the first signals or a command of the plurality of the first signals, a second routine to determine the mask length code, a third routine to execute a cyclic redundancy check of data code included in each of the plurality of first signals, and a fourth routine to determine the number of the plurality of first signals or the number of the plurality of second signals.

10. The semiconductor device according to claim 9, wherein the wireless transmission uses radio frequency signals.

11. The semiconductor device according to claim 9, further comprising an auxiliary arithmetic circuit to execute the program.

12. The semiconductor device according to claim 9, wherein each of the plurality of first signals comprises a start code of a frame, a flag code, a command code, a data code, a cyclic redundancy check code, and an end code of a frame.

13. The semiconductor device according to claim 9, wherein the circuit comprises at least one of an antenna, a resonant circuit, a power supply circuit, a reset circuit, a clock generating circuit, a demodulation circuit, a modulation circuit, and a power source managing circuit.

14. The semiconductor device according to claim 9, wherein the semiconductor device is at least one of an ID chip, an IC tag, an ID tag, an RF tag, a wireless tag, an electronic tag, and a transponder.

15. A semiconductor device comprising:
a circuit for wirelessly transmitting a plurality of first signals to outside of the semiconductor device or for receiving a plurality of second signals from outside of the semiconductor device;
a central processing unit interface;
a RAM directly connected to the central processing unit interface and configured to store processing data;
a ROM directly connected to the central processing unit interface and configured to store a program to avoid a collision of the plurality of first signals or the plurality of second signals;
a control register directly connected to the central processing unit interface;
a code extracting circuit connected between the circuit and the control register;
an encoding circuit connected between the circuit and the control register;
a central processing unit directly connected to the central processing unit interface and configured to execute the program; and
a controller to provide the central processing unit with a mask length code, the controller comprises the control register, the code extracting circuit and the encoding circuit,
wherein each of the plurality of first signals comprises a start code of a frame, and
wherein the program is executed when the control register determines the start code of a frame.

16. The semiconductor device according to claim 15, wherein the wireless transmission uses radio frequency signals.

17. The semiconductor device according to claim 15, wherein the program comprises a first routine to determine a flag of the plurality of the first signals or a command of the plurality of the first signals, a second routine to determine the mask length code, a third routine to execute a cyclic redundancy check of data code included in each of the plurality of first signals, and a fourth routine to determine the number of the plurality of first signals or the number of the plurality of second signals.

18. The semiconductor device according to claim 15, further comprising an auxiliary arithmetic circuit to execute the program.

19. The semiconductor device according to claim 15, wherein each of the plurality of first signals comprises a start code of a frame, a flag code, a command code, a data code, a cyclic redundancy check code, and an end code of a frame.

20. The semiconductor device according to claim 15, wherein the circuit comprises at least one of an antenna, a resonant circuit, a power supply circuit, a reset circuit, a clock generating circuit, a demodulation circuit, a modulation circuit, and a power source managing circuit.

21. The semiconductor device according to claim 15, wherein the semiconductor device is at least one of an ID chip, an IC tag, an ID tag, an RF tag, a wireless tag, an electronic tag, and a transponder.

22. The semiconductor device according to claim 9, further comprising a random access memory,
   wherein the random access memory is configured to store data; and
   wherein the memory is a read-only memory configured to store the program.

23. The semiconductor device according to claim 15, further comprising a random access memory,
   wherein the random access memory is configured to store data; and
   wherein the memory is a read-only memory configured to store the program.

* * * * *